US012796273B2

(12) United States Patent
Lim et al.

(10) Patent No.: US 12,796,273 B2
(45) Date of Patent: Nov. 10, 2026

(54) DISPLAY DEVICE

(71) Applicant: Samsung Display Co., Ltd., Yongin-si (KR)

(72) Inventors: Sanghyung Lim, Yongin-si (KR); Ran Kim, Yongin-si (KR); Mihyang Sheen, Yongin-si (KR); Sunghwan Youn, Yongin-si (KR); Dongha Lee, Yongin-si (KR); Soonmi Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 585 days.

(21) Appl. No.: 18/214,414

(22) Filed: Jun. 26, 2023

(65) Prior Publication Data

US 2024/0008337 A1 Jan. 4, 2024

(30) Foreign Application Priority Data

Jul. 1, 2022 (KR) ........................ 10-2022-0081017

(51) Int. Cl.
*H10K 59/38* (2023.01)
*H10K 59/80* (2023.01)

(52) U.S. Cl.
CPC ........... *H10K 59/38* (2023.02); *H10K 59/871* (2023.02); *H10K 59/873* (2023.02); *H10K 59/879* (2023.02)

(58) Field of Classification Search
CPC .... H10K 59/38; H10K 59/879; H10K 59/873; H10K 59/871
USPC .......................................................... 313/500
See application file for complete search history.

(56) References Cited

U.S. PATENT DOCUMENTS

| | | | | |
|---|---|---|---|---|
| 11,730,037 | B2 | 8/2023 | Yoon et al. | |
| 2019/0206960 | A1* | 7/2019 | Lee | H10K 50/171 |
| 2021/0135147 | A1* | 5/2021 | Wang | H10K 59/8722 |
| 2021/0376291 | A1* | 12/2021 | Park | H10K 59/122 |
| 2022/0157893 | A1 | 5/2022 | Baek et al. | |

FOREIGN PATENT DOCUMENTS

| | | | |
|---|---|---|---|
| KR | 10-2019-0081954 | A | 7/2019 |
| KR | 10-2021-0155037 | A | 12/2021 |
| KR | 10-2022-0065919 | A | 5/2022 |

* cited by examiner

*Primary Examiner* — Elmito Breval
*Assistant Examiner* — Hana S Featherly
(74) *Attorney, Agent, or Firm* — Womble Bond Dickinson (US) LLP

(57) ABSTRACT

Provided is a display device. The display device includes: a first display substrate; a second display substrate including a non-display region and first, second, and third pixel regions; and a sealing member overlapping the non-display region when viewed on a plane and between the first display substrate and the second display substrate. A dam pattern is arranged or a trench pattern is defined on a lower surface of the second display substrate. The dam pattern and the trench pattern control flow of a liquid organic material provided in the display region. An organic layer is formed only inside the dam pattern and the trench pattern so that a path into which moisture is introduced is not formed. This is because the organic layer is not on an outer region of a pattern on which the sealing member is located and the trench pattern.

26 Claims, 27 Drawing Sheets

DISPLAY DEVICE

CROSS-REFERENCE TO RELATED APPLICATIONS

The present application claims priority to and the benefit of Korean Patent Application No. 10-2022-0081017, filed on Jul. 1, 2022, in the Korean Intellectual Property Office, the entire contents of which are hereby incorporated herein by reference.

BACKGROUND

1. Field

Aspects of some embodiments of the present disclosure herein relate to a display device.

2. Description of the Related Art

A display device generally includes a transmissive display device that selectively transmits source light generated from a light source, and an emissive display device that generates source light from a display device itself. The display device may include different types of functional patterns according to pixels to generate images. The functional patterns may transmit only source light having a predetermined wavelength range or may convert color of the source light.

The above information disclosed in this Background section is only for enhancement of understanding of the background and therefore the information discussed in this Background section does not necessarily constitute prior art.

SUMMARY

Aspects of some embodiments of the present disclosure herein relate to a display device, and for example, to a display device including two display substrates and a sealing member bonding the two display substrates.

Aspects of some embodiments of the present disclosure include a display device having reduced defect rates.

According to some embodiments of the inventive concept, a display device includes: a first display substrate including first, second, and third light emitting elements; a second display substrate including a non-display region and a display region including first, second, and third pixel regions respectively corresponding to the first, second, and third light emitting elements; and a sealing member overlapping the non-display region when viewed on a plane and between the first display substrate and the second display substrate. According to some embodiments, the second display substrate may include: a base layer; first, second, and third color filters on a surface of the base layer and respectively overlapping the first, second, and third pixel regions; at least one dam pattern on the surface of the base layer and overlapping the non-display region when viewed on a plane; an organic layer below the first, second, and third color filters, a first inorganic layer below the organic layer and overlapping the non-display region and the display region; a division pattern below the first inorganic layer and having first, second, and third openings respectively corresponding to the first, second, and third pixel regions; first, second, and third light control patterns inside the first, second, and third openings, respectively; and a second inorganic layer below the division pattern and the first, second, and third light control patterns and overlapping the non-display region and the display region. According to some embodiments, the sealing member may overlap the first inorganic layer and the second inorganic layer in the non-display region and non-overlap the organic layer, and may be farther from the display region than the at least one dam pattern when viewed on a plane.

According to some embodiments, the at least one dam pattern may include first to n-th dam patterns (where n is a natural number of 2 or greater) arranged to be gradually further distant from the display region, and at least one of the first to n-th dam patterns may have a closed line shape.

According to some embodiments, the at least one dam pattern may include first to n-th dam patterns (where n is a natural number of 2 or greater) arranged to be gradually further distant from the display region, and the first dam pattern may have a lower height than the n-th dam pattern.

According to some embodiments, the at least one dam pattern may include first to n-th dam patterns (where n is a natural number of 2 or greater) arranged to be gradually further distant from the display region, any one of the first to n-th dam patterns may include a first layer, a second layer below the first layer, and a third layer below the second layer, and the first layer may include the same material as any one of the first, second, and third color filters, the second layer may include the same material as another one of the first, second, and third color filters, and the third layer may include the same material as the other one of the first, second, and third color filters.

According to some embodiments, the second layer may surround a side surface of the first layer, and the third layer surrounds a side surface of the second layer.

According to some embodiments, the first layer may have a width greater than or equal to a width of the second layer, and the third layer may have a width less than or equal to the width of the second layer.

According to some embodiments, the at least one dam pattern may include first to n-th dam patterns (where n is a natural number of 2 or greater) arranged to be gradually further distant from the display region, and the organic layer may overlap the first dam pattern, and an edge of the organic layer may be positioned between adjacent dam patterns among the second to n-th dam patterns.

According to some embodiments, the display region may include further a peripheral region between the first, second, and third pixel regions, and at least two or more color filters among the first, second, and third color filters may overlap in the peripheral region.

According to some embodiments, each of the first, second, and third light emitting elements may generate blue source light, first and second filter openings respectively corresponding to the first and second pixel regions may be defined in the third color filter, the third color filter may overlap the third pixel region, and the third color filter may be a blue color filter.

According to some embodiments, the first and second light control patterns may include a base resin and quantum dots mixed with the base resin, and the third light control pattern may include a base resin without quantum dots.

According to some embodiments, each of the first, second, and third light emitting elements may include a first electrode, a second electrode on the first electrode, and an emission layer between the first electrode and the second electrode, and the emission layer of the first light emitting element, the emission layer of the second light emitting element, and the emission layer of the third light emitting element may have a single-body shape.

According to some embodiments, the organic layer may have a lower refractive index than the first inorganic layer.

According to some embodiments, the organic layer may include a synthetic resin and porogen or hollow silica, which is mixed with the synthetic resin.

According to some embodiments, the display device may further include a filling material filling a gap between the first display substrate and the second display substrate.

According to some embodiments, at least one trench pattern may be defined on the surface of the base layer, the at least one trench pattern may overlap the non-display region when viewed on a plane, and the organic layer may be inside the at least one trench pattern.

According to some embodiments of the inventive concept, a display device includes: a first display substrate including a plurality of light emitting elements; a second display substrate including a non-display region and a display region including a plurality of pixel regions respectively corresponding to the plurality of light emitting elements; and a sealing member overlapping the non-display region when viewed on a plane and between the first display substrate and the second display substrate so as to maintain a gap between the first display substrate and the second display substrate. According to some embodiments, the second display substrate may include: a base layer; a plurality of color filters on a surface of the base layer and overlapping each of the plurality of pixel regions; a plurality of organic patterns each below the plurality of color filters and spaced apart from each other; an inorganic layer below the plurality of organic patterns and overlapping the non-display region and the display region; a division pattern below the inorganic layer and having a plurality of openings respectively corresponding to the plurality of pixel regions; and a quantum dot pattern in a corresponding one of the plurality of openings. According to some embodiments, the sealing member may overlap the inorganic layer in the non-display region and non-overlaps the plurality of organic patterns, and each of the organic patterns may have a lower refractive index than the inorganic layer.

According to some embodiments of the inventive concept, a display device includes: a first display substrate including first, second, and third light emitting elements; a second display substrate including a non-display region and a display region including first, second, and third pixel regions respectively corresponding to the first, second, and third light emitting elements; and a sealing member overlapping the non-display region when viewed on a plane and between the first display substrate and the second display substrate. According to some embodiments, the second display substrate may include: a base layer overlapping the non-display region when viewed on a plane and having first to n-th trench patterns (where n is a natural number of 2 or greater) defined on a lower surface thereof so as to be gradually further distant from the display region; first, second, and third color filters on the lower surface of the base layer and respectively overlapping the first, second, and third pixel regions; an organic layer below the first, second, and third color filters, a first inorganic layer below the organic layer and overlapping the non-display region and the display region; a division pattern below the first inorganic layer and having first, second, and third openings respectively corresponding to the first, second, and third pixel regions; first, second, and third light control patterns inside the first, second, and third openings, respectively; and a second inorganic layer below the division pattern and the first, second, and third light control patterns and overlapping the non-display region and the display region. According to some embodiments, the sealing member may overlap the first inorganic layer and the second inorganic layer in the non-display region and non-overlap the organic layer, and may be farther from the display region than the n-th trench pattern when viewed on a plane.

According to some embodiments, at least one of the first to n-th trench patterns may have a closed line shape.

According to some embodiments, the organic layer may overlap the first trench pattern, and an edge of the organic layer may be positioned within the second to n-th trench patterns.

According to some embodiments, each of the first to n-th trench patterns may include a bottom surface, and a first side surface and a second side surface that connect the bottom surface and the lower surface of the base layer, respectively. According to some embodiments, the distance between the first side surface and the second side surface may increase from the lower surface of the base layer towards the bottom surface.

According to some embodiments of the inventive concept, a display device includes: a base layer including a non-display region and a display region; first, second, and third light emitting elements on the base layer and overlapping the display region; a thin film encapsulation layer sealing the first, second, and third light emitting elements; a division pattern on the thin film encapsulation layer and first, second, and third openings respectively corresponding to the first, second, and third light emitting elements being defined in the division pattern; first, second, and third light control patterns respectively inside the first, second, and third openings; at least one insulating layer on the division pattern and the first, second, and third light control patterns; first, second, and third color filters on the at least one insulating layer and respectively overlapping the first, second, and third light control patterns; at least one dam pattern on the thin film encapsulation layer and overlapping the non-display region; and an organic layer covering the first, second, and third color filters and overlapping the non-display region and the display region, wherein an edge of the organic layer may be inside the at least one dam pattern, and the at least one dam pattern may include the same material as at least one of the first, second, or third color filters.

According to some embodiments, the at least one insulating layer may include a layer having a refractive index of about 1.1 to about 1.5.

According to some embodiments, the at least one insulating layer may further include inorganic layers each below and above the layer having a refractive index of about 1.1 to about 1.5.

According to some embodiments, the at least one dam pattern may include first to n-th dam patterns (where n is a natural number of 2 or greater) arranged to be gradually further distant from the display region, and at least one of the first to n-th dam patterns may have a closed line shape.

According to some embodiments, the at least one dam pattern may include first to n-th dam patterns (where n is a natural number of 2 or greater) arranged to be gradually further distant from the display region, any one of the first to n-th dam patterns may include a first layer, a second layer below the first layer, and a third layer below the second layer, and the first layer may include the same material as any one of the first, second, and third color filters, the second layer may include the same material as another one of the first, second, and third color filters, and the third layer may include the same material as the other one of the first, second, and third color filters.

According to some embodiments, the first and second light control patterns may include a base resin and quantum dots, and the third light control pattern may include a base resin.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1A:
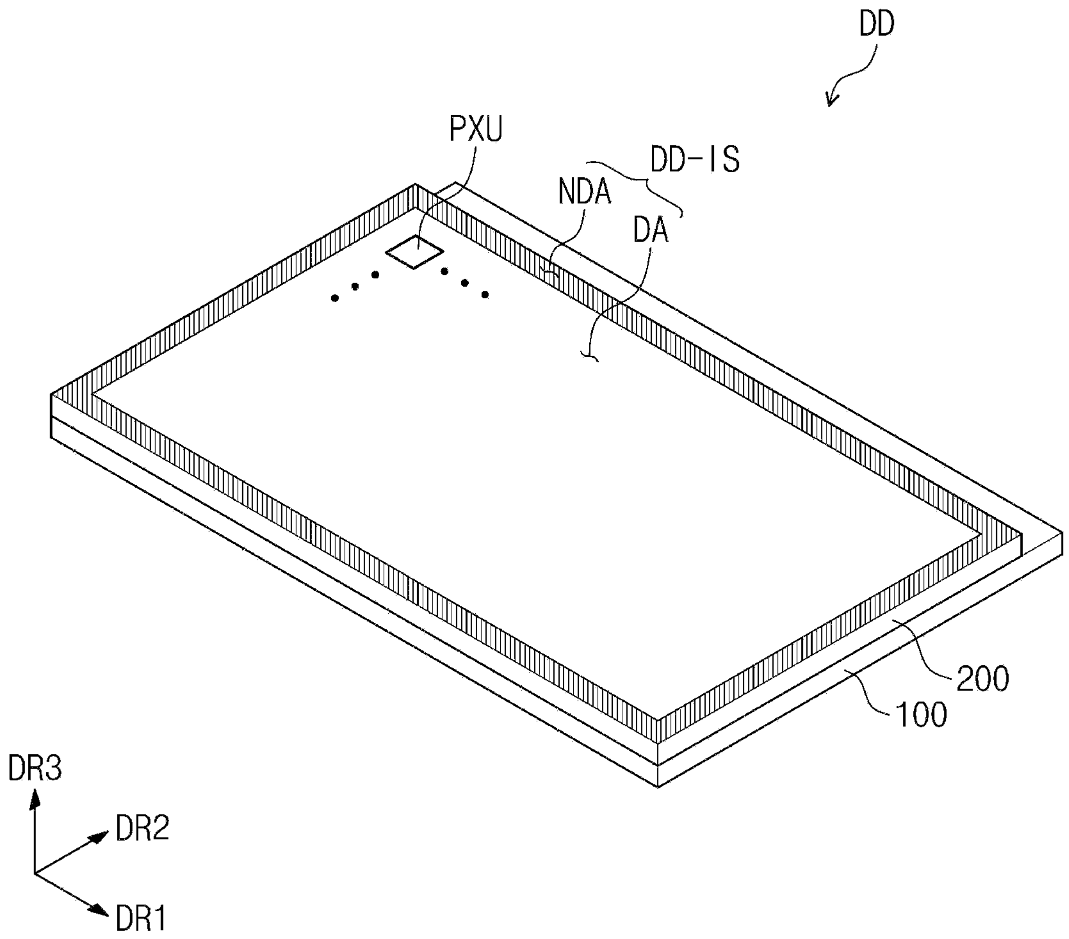
FIG. 1A is a perspective view of a display device according to some embodiments of the inventive concept.

It will be understood that when an element (or a region, a layer, a portion, or the like) is referred to as "being on", "connected to" or "coupled to" another element, it can be directly located on, connected or coupled to the other element, or intervening elements may be located therebetween.

Like reference numerals refer to like elements. In addition, in the drawings, the thickness, the ratio, and the dimensions of elements are exaggerated for an effective description of technical contents. The term "and/or," includes all combinations of one or more of which associated configurations may define.

It will be understood that, although the terms first, second, etc. may be used herein to describe various elements, these elements should not be limited by these terms. These terms are only used to distinguish one element from another element. For example, a first element may be referred to as a second element, and similarly, a second element may be referred to as a first element without departing from the teachings of the present disclosure. The singular forms are intended to include the plural forms as well, unless the context clearly indicates otherwise.

Also, terms of "below", "on lower side", "above", "on upper side", or the like may be used to describe the relationships of the components shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and are expressly defined herein unless they are interpreted in an ideal or overly formal sense.

Hereinafter, embodiments of the inventive concept will be described with reference to the accompanying drawings.

Figure 1B:
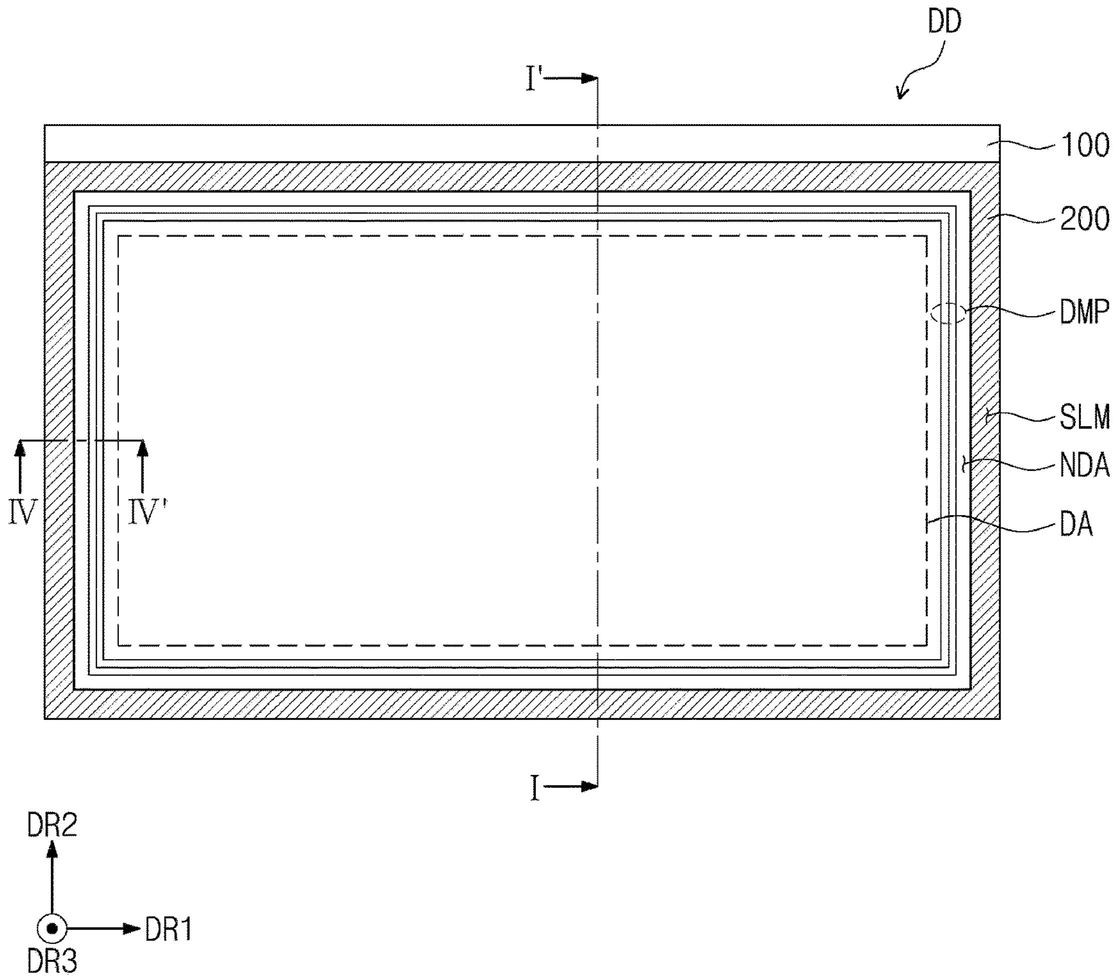
FIG. 1B is a plan view of a display device according to some embodiments of the inventive concept.
Figure 1C:
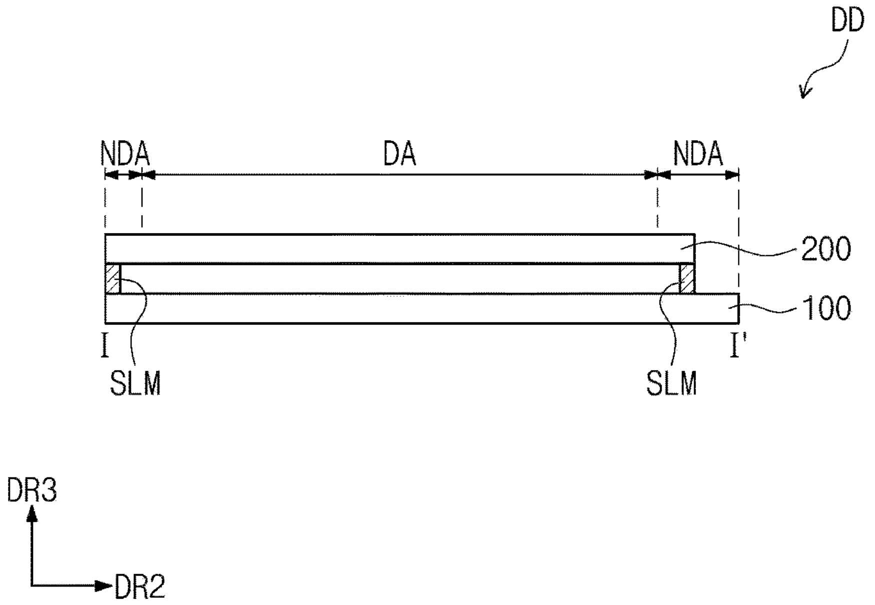
FIG. 1C is a cross-sectional view of a display device according to some embodiments of the inventive concept.

FIG. 1A is a perspective view of a display device DD according to some embodiments of the inventive concept. FIG. 1B is a plan view of a display device DD according to some embodiments of the inventive concept. FIG. 1C is a cross-sectional view of a display device DD according to some embodiments of the inventive concept.

Referring to FIG. 1A, the display device DD may display images through a display surface DD-IS. The display surface DD-IS is parallel to a plane defined by a first direction DR1 and a second direction DR2. An upper surface of a member located on an uppermost side of the display device DD may be defined as the display surface DD-IS.

A normal direction of the display surface DD-IS, that is, a thickness direction of the display device DD, is indicated by a third direction DR3. A front surface (or an upper surface) and a rear surface (or a lower surface) of respective layers or units which will be described below are separated by the third direction DR3.

The display device DD may include a display region DA and a non-display region NDA. Unit pixels PXU are located in the display region DA, and the unit pixels PXU are not located in the non-display region NDA. The non-display region NDA is defined along an edge of the display surface DD-IS. The non-display region NDA may surround the display region DA. According to some embodiments of the inventive concept, the non-display region NDA may be omitted or may be located only on one side of the display region DA. Although a flat display device DD is shown in FIG. 1A, the display device DD may have a curved shape, may be rollable, or may be slidable from a housing.

The unit pixels PXU shown in FIG. 1A may define a row and a column. The unit pixels PXU are a minimum repeating unit, and the unit pixels PXU may include at least one pixel. The unit pixels PXU may include a plurality of pixels providing light of different colors.

Referring to FIGS. 1B and 1C, the display device DD may include a first display substrate 100 (or a lower display substrate) and a second display substrate 200 (or an upper display substrate) facing the first display substrate 100 and spaced apart from the first display substrate 100. A cell gap (e.g., a set or predetermined cell gap) may be formed between the first display substrate 100 and the second display substrate 200. The cell gap may be maintained through a sealing member SLM bonding the first display substrate 100 and the second display substrate 200. The sealing member SLM may include a binder resin and inorganic fillers mixed with the binder resin. The sealing member SLM may further include other additives. The additives may include an amine-based curing agent and a photo-initiator. The additives may further include a silane-based additive and an acryl-based additive. The sealing member SLM may include an inorganic material such as a frit.

The sealing member SLM overlaps the non-display region NDA, and the display region DA is located inside the sealing member SLM. Although the sealing member SLM is shown to be aligned with an edge of the second display substrate 200 when viewed on a plane (e.g., in a plan view, or from a direction normal or perpendicular with respect to a plane defined by the first direction DR1 and the second direction DR2), the embodiments of the inventive concept are not limited thereto.

Referring to FIGS. 1B and 1C, as in the display region DA and the non-display region NDA of the display device DD, the display region DA and the non-display region NDA may be defined in each of the first display substrate 100 and the second display substrate 200. Hereinafter, the display region DA of the display device DD may indicate the display region DA of each of the first display substrate 100 and the second display substrate 200, and the non-display region NDA of the display device DD may indicate the non-display region NDA of each of the first display substrate 100 and the second display substrate 200.

Although the second display substrate 200 is shown to have a smaller area than the first display substrate 100 in FIGS. 1B and 1C, the embodiment of the inventive concept is not limited thereto. A driving chip may be mounted on a portion of the first display substrate 100 exposed from the second display substrate 200, or a circuit board may be bonded. A chip on film (COF) may be bonded to a portion of the first display substrate 100 exposed from the second display substrate 200.

Referring to FIG. 1B, at least one dam pattern DMP is located inside the sealing member SLM. Three dam patterns DMP are shown by way of example. The dam patterns DMP overlap the non-display region NDA. At least one of the dam patterns DMP may have a closed line shape. Each of the dam patterns DMP in FIG. 1B has a closed line shape, but is not limited thereto. Detailed descriptions of the dam patterns DMP will be described later.

Figure 2:
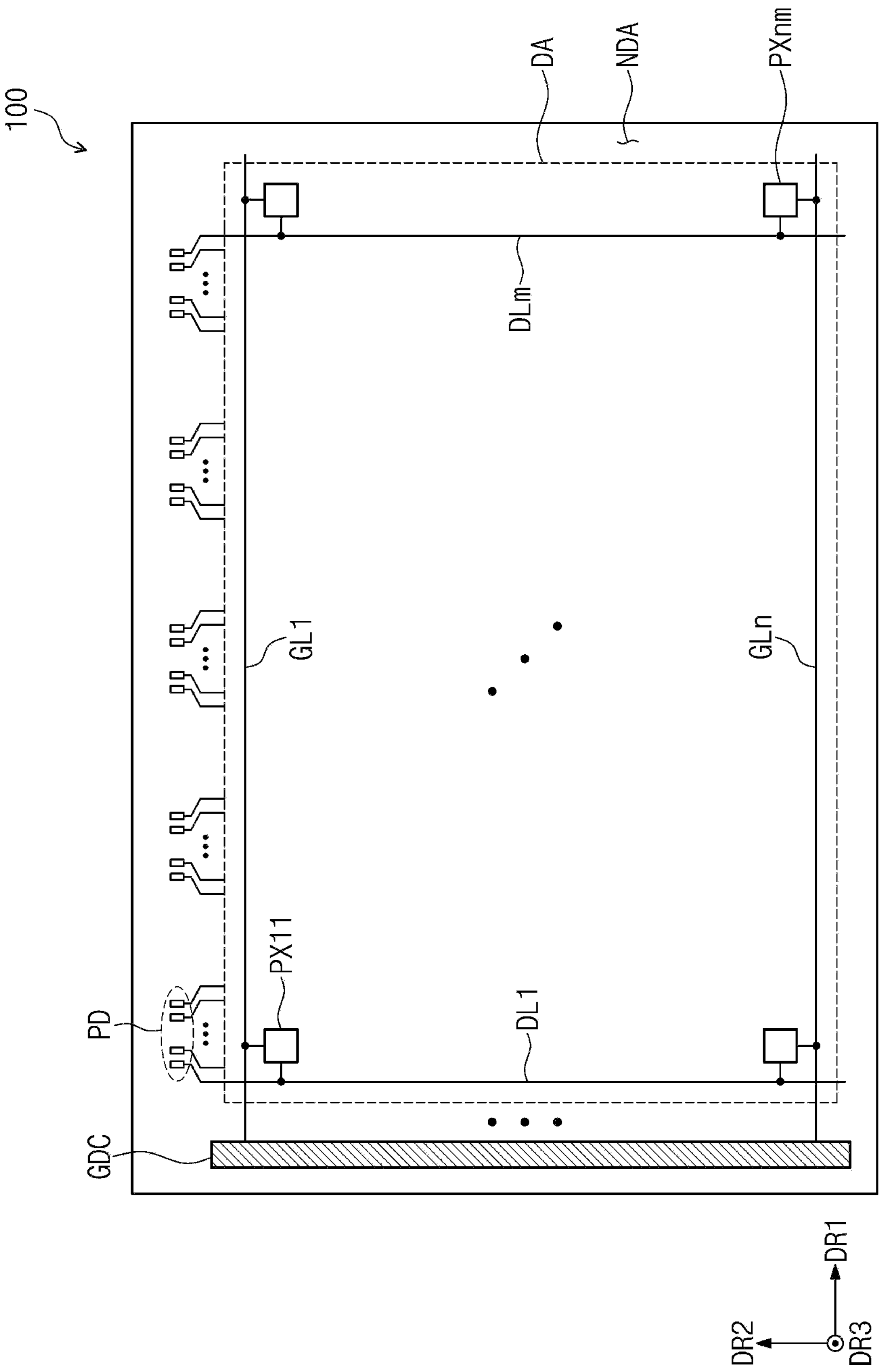
FIG. 2 is a plan view of a first display substrate according to some embodiments of the inventive concept.

FIG. 2 is a plan view of the first display substrate 100 according to some embodiments of the inventive concept.

FIG. 2 shows an arrangement relationship of signal lines GL1 to GLn and DL1 to DLm and pixels PX11 to PXnm when viewed on a plane. The signal lines GL1 to GLn and DL1 to DLm may include a plurality of gate lines GL1 to GLn and a plurality of data lines DL1 to DLm.

According to some embodiments, each of the pixels PX11 to PXnm is connected to a corresponding gate line among the plurality of gate lines GL1 to GLn and a corresponding data line among the plurality of data lines DL1 to DLm. Each of the pixels PX11 to PXnm may include a pixel driving circuit and a light emitting element. More types of signal lines may be provided in a display panel DP according to configuration of the pixel driving circuit of the pixels PX11 to PXnm.

A gate driving circuit GDC may be integrated on the display panel DP through an oxide silicon gate (OSG) driver circuit process or an amorphous silicon gate (ASG) driver circuit process. The gate driving circuit GDC connected to the gate lines GL1 to GLn is located at one side of the non-display region NDA in the first direction DR1. Pads PD connected to ends of the plurality of data lines DL1 to DLm are located on one side of the non-display region NDA in the second direction DR2. The pads PD may be exposed from the second display substrate 200 as shown in FIGS. 1B and 1C.

Figure 3A:
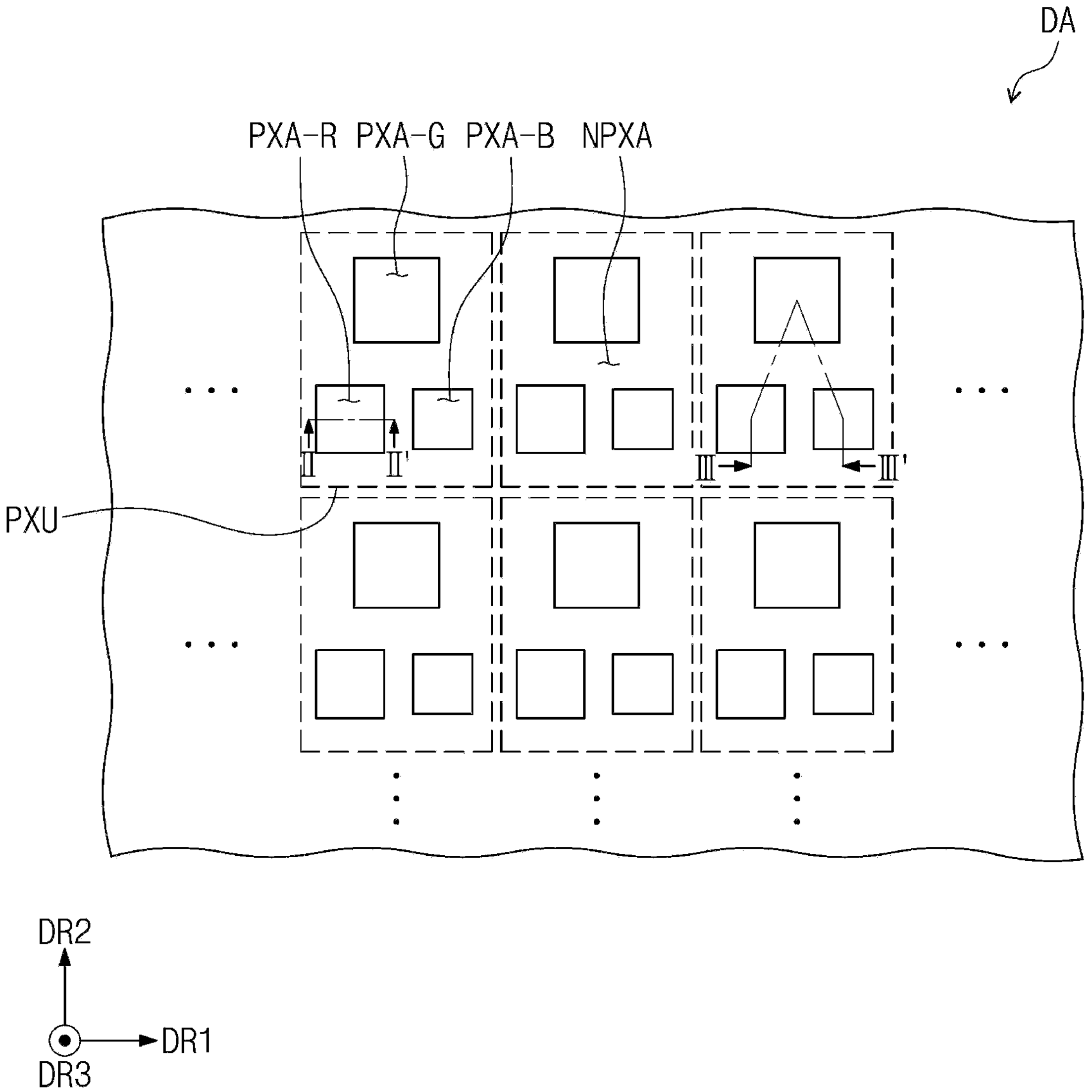
FIG. 3A is a plan view enlarging a display region according to some embodiments of the inventive concept.
Figure 3B:
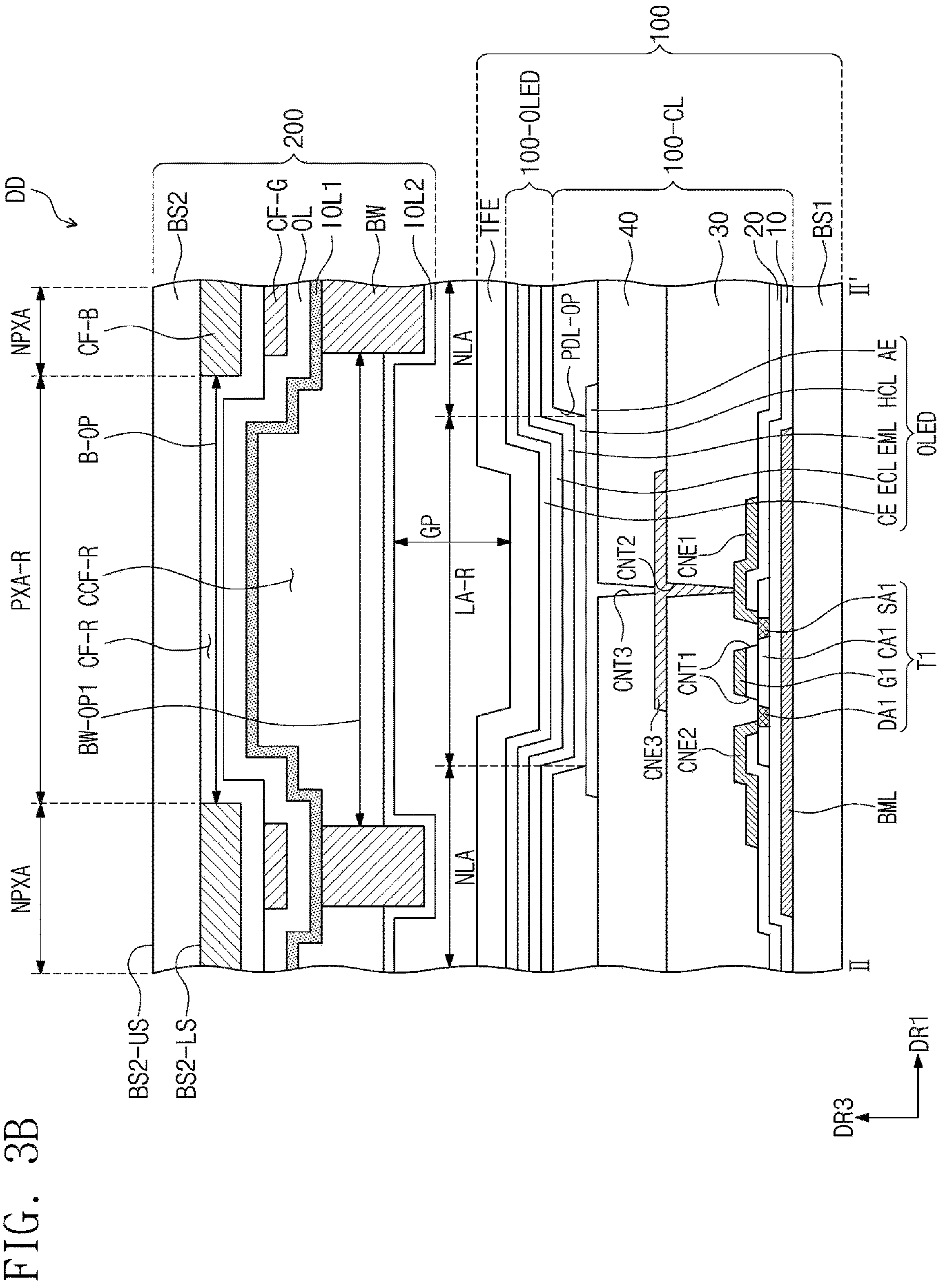
FIG. 3B is a cross-sectional view of a display region according to some embodiments of the inventive concept.
Figure 3C:
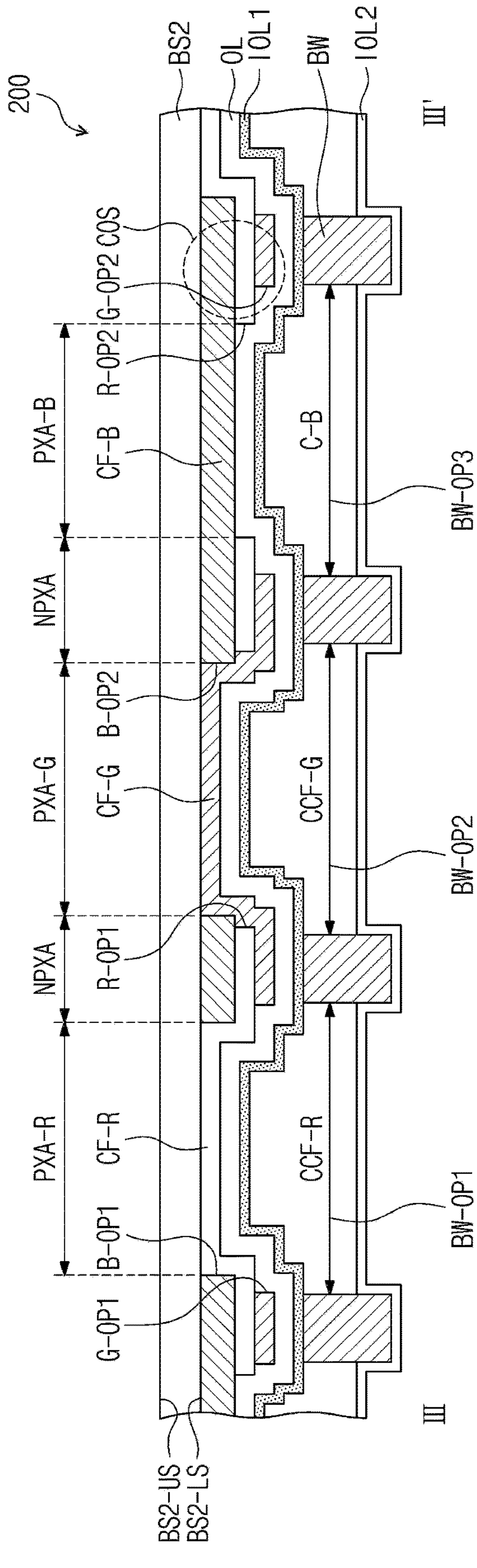
FIG. 3C is a cross-sectional view of a second display substrate according to some embodiments of the inventive concept.

FIG. 3A is a plan view enlarging a display region DA according to some embodiments of the inventive concept. FIG. 3B is a cross-sectional view of a display region DA according to some embodiments of the inventive concept. FIG. 3C is a cross-sectional view of the second display substrate 200 according to some embodiments of the inventive concept.

As shown in FIG. 3A, the unit pixels PXU are arranged in each of the first direction DR1 and the second direction DR2. According to some embodiments, the unit pixels PXU may include a first pixel region PXA-R, a second pixel region PXA-G, and a third pixel region PXA-B that emit light of different colors. The first pixel region PXA-R, the second pixel region PXA-G, and the third pixel region PXA-B may emit red light, green light, and blue light, respectively.

The first pixel region PXA-R, the second pixel region PXA-G, and the third pixel region PXA-B may be defined with respect to the second display substrate 200. A peripheral region NPXA is located between the first pixel region PXA-R, the second pixel region PXA-G, and the third pixel region PXA-B. The peripheral region NPXA may set a boundary between the first to third pixel regions PXA-R, PXA-G, and PXA-B to prevent the first to third pixel regions PXA-R, PXA-G, and PXA-B from being color-mixed.

Among the pixels PX11 to PXnm of the first display substrate 100 (see FIG. 2), a pixel overlapping the first pixel region PXA-R of the second display substrate 200 is defined as a first pixel, a pixel overlapping the second pixel region PXA-G may be defined as a second pixel, and a pixel overlapping the third pixel region PXA-B may be defined as a third pixel. However, as will be described later, the first pixel, the second pixel, and the third pixel are not distinguished from each other and have the same configuration. The first pixel, the second pixel, and the third pixel are not distinguished from each other, and are defined only as pixels overlapping the first pixel region PXA-R, the second pixel region PXA-G, and the third pixel region PXA-B, respectively.

Each of the first pixel, the second pixel, and the third pixel may include light emitting elements, and the light emitting elements of the first pixel, the second pixel, and the third pixel may generate source light of the same color. However, light emitting areas of the light emitting elements of the first pixel, the second pixel, and the third pixel may be the same or different. The light emitting areas corresponds to an area of a light emitting region LA-R, which will be described later.

The source light generated from the light emitting elements of the first pixel, the second pixel, and the third pixel is converted into light of different colors and emitted through the first pixel region PXA-R, the second pixel region PXA-G, and the third pixel region PXA-B. The second display substrate 200, which will be described later, converts the source light generated from the first display substrate 100 into light of a different color.

Referring to FIG. 3A, the first pixel region PXA-R and the third pixel region PXA-B are arranged in the same row, and the second pixel region PXA-G is located in a row different from that of the first pixel region PXA-R and the third pixel region PXA-B. The second pixel region PXA-G may have a largest area and the third pixel region PXA-B may have a smallest area, but the embodiment of the inventive concept is not necessarily limited thereto. According to some embodiments, the first pixel region PXA-R, the second pixel region PXA-G, and the third pixel region PXA-B having a substantially square shape are shown as an example, but the embodiment of the inventive concept is not necessarily limited thereto.

An arrangement structure of the first pixel region PXA-R, the second pixel region PXA-G, and the third pixel region PXA-B in the unit pixels PXU shown in FIG. 3A is presented merely as an example and the embodiment of the inventive concept is not necessarily limited thereto. According to some embodiments of the inventive concept, the first pixel region PXA-R, the second pixel region PXA-G, and the third pixel region PXA-B may be arranged in the same row. In addition, the arrangement of the first pixel region PXA-R, the second pixel region PXA-G, and the third pixel region PXA-B of the unit pixels PXU is not necessarily the same.

With reference to FIG. 3B, cross-sectional structures of the first display substrate 100 and the second display substrate 200 around the first pixel region PXA-R will be described in detail. A cell gap (e.g., a set or predetermined cell gap) GP may be formed between the first display substrate 100 and the second display substrate 200, and a gas or a filling material may be filled in the cell gap GP. For example, an epoxy-based organic material may be located between the first display substrate 100 and the second display substrate 200.

Referring to FIG. 3B, the first display substrate 100 may include a first base layer BS1 (or a lower base layer), a circuit layer 100-CL, a display element layer 100-OLED, and a thin film encapsulation layer TFE. The cross-sectional structure of the first display substrate 100 corresponding to the first pixel region PXA-R shown in FIG. 3B may be the same as that of the first display substrate 100 corresponding to the second pixel region PXA-G and the third pixel region PXA-B shown in FIG. 3A.

The first base layer BS1 may include a synthetic resin substrate or a glass substrate. The first base layer BS1 may include a first synthetic resin layer, a second synthetic resin layer, and an inorganic layer therebetween. The synthetic resin layer may include a thermosetting resin. In particular, the synthetic resin layer may be a polyimide-based resin layer, and the material is not particularly limited. The synthetic resin layer may include at least one of an acryl-based resin, a methacryl-based resin, polyisoprene, a vinyl-based resin, an epoxy-based resin, a urethane-based resin, a cellulose-based resin, a siloxane-based resin, a polyamide-based resin, or a perylene-based resin.

A light blocking pattern BML may be located on the first base layer BS1. The light blocking pattern BML may include a metal. A signal line may be located on the same layer as the light blocking pattern BML. A first insulating layer 10 covering the light blocking pattern BML is located on the first base layer BS1.

A semiconductor pattern overlapping the light blocking pattern BML is located on the first insulating layer 10. The semiconductor pattern may have a different doping concentration depending on regions, and the doping concentration may determine electrical characteristics. The semiconductor pattern may include a first region having high conductivity and a second region having low conductivity. The first region may be doped with an N-type dopant or a P-type dopant. A P-type transistor may include a doped region doped with the P-type dopant, and a N-type transistor may include a doped region doped with the N-type dopant. The second region may be a non-doped region or may be doped in a lower concentration than the first region.

The semiconductor pattern may include a source region SA1, a channel region CA1 (or an active region), and a drain region DA1. A second insulating layer 20 is located on the first insulating layer 10. Contact holes CNT1 exposing the source region SA1 and the drain region DA1 are defined in the second insulating layer 20. The first insulating layer 10 and the second insulating layer 20 may be inorganic layers.

A gate electrode G1 is located on the second insulating layer 20. Connection electrodes CNE1 and CNE2 are located on the second insulating layer 20. The first connection electrode CNE1 may electrically connect a source region SA1 of a first transistor T1 to the drain or source of another transistor included in a pixel driving circuit. The second connection electrode CNE2 may electrically connect the drain region DA1 of the first transistor T1 to another transistor or signal line included in a pixel driving circuit.

A third insulating layer 30 is located on the second insulating layer 20. A third connection electrode CNE3 is located on the third insulating layer 30. The third connection electrode CNE3 may be connected to the first connection electrode CNE1 through a contact hole CNT2 passing through the third insulating layer 30. A fourth insulating layer 40 is located on the third insulating layer 30. The first electrode AE is located on the fourth insulating layer 40. According to some embodiments, the first electrode AE is described as an anode AE. The anode AE may be connected to the third connection electrode CNE3 through a contact hole CNT3 passing through the fourth insulating layer 40. The third insulating layer 30 and the fourth insulating layer may be organic layers.

A light emitting element OLED and a pixel defining film PDL are located on the fourth insulating layer 40. At least a portion of the anode AE is exposed through an opening PDL-OP of the pixel defining film PDL. The opening PDL-OP of the pixel defining film PDL may define the light emitting region LA-R. A region in which the pixel defining film PDL is located may be defined as a non-light emitting region NLA.

A hole control layer HCL may be commonly located in the light emitting region LA-R and the non-light emitting region NLA. A common layer such as the hole control layer HCL may commonly overlap the plurality of unit pixels PXU shown in FIG. 3A. The hole control layer HCL may include a hole transport layer and a hole injection layer.

An emission layer EML is located on the hole control layer HCL. The emission layer EML may be commonly located in the light emitting region LA-R and the non-light emitting region NLA. The emission layer EML may generate source light. The emission layer EML may include an organic light emitting material or an inorganic light emitting material. According to some embodiments, the source light may be blue light.

An electron control layer ECL is located on the emission layer EML. The electron control layer ECL may include an electron transport layer and an electron injection layer. A second electrode CE is located on the electron control layer ECL. According to some embodiments, the second electrode is described as a cathode CE. The thin film encapsulation layer TFE is located on the cathode CE. The thin film encapsulation layer TFE is commonly located on the plurality of unit pixels PXU shown in FIG. 3A. According to some embodiments, the thin film encapsulation layer TFE directly covers the cathode CE.

The thin film encapsulation layer TFE includes at least an inorganic layer or an organic layer. According to some embodiments of the inventive concept, the thin film encapsulation layer TFE may include two inorganic layers and an organic layer located therebetween. According to some embodiments of the inventive concept, the thin film encapsulation layer may include a plurality of inorganic layers and a plurality of organic layers, which are alternately stacked.

As shown in FIG. 3B, the second display substrate 200 may include a second base layer BS2 (or an upper base layer). The second base layer BS2 may include a synthetic resin substrate or a glass substrate. The second base layer BS2 may include a thermosetting resin. In particular, the synthetic resin layer may be a polyimide-based resin layer, and the material is not particularly limited. The synthetic resin layer may include at least one of an acryl-based resin, a methacryl-based resin, polyisoprene, a vinyl-based resin, an epoxy-based resin, a urethane-based resin, a cellulose-based resin, a siloxane-based resin, a polyamide-based resin, or a perylene-based resin.

Color filters CF-R, CF-G, and CF-B are located on a lower surface BS2-LS of the second base layer BS2. Referring to FIGS. 3B and 3C, the color filters CF-R, CF-G, and CF-B may include first, second, and third color filters CF-R, CF-G, and CF-B overlapping the first, second, and third pixel regions PXA-R, PXA-G, and PXA-B, respectively. The first, second, and third color filters CF-R, CF-G, and CF-B may be a red color filter, a green color filter, and a blue color filter, respectively.

The first pixel region PXA-R, the second pixel region PXA-G, the third pixel region PXA-B, and the peripheral region NPXA may be defined by the first, second, and third color filters CF-R, CF-G, and CF-B. The peripheral region NPXA may be defined as a region in which two or more color filters among the first, second, and third color filters CF-R, CF-G, and CF-B overlap. The first pixel region PXA-R may be defined as a region in which only the first color filter CF-R overlaps, the second pixel region PXA-G may be defined as a region in which only the second color filter CF-G overlaps, and the third pixel region PXA-B may be defined as a region in which only the third color filter CF-B overlaps. When two or more color filters overlap, the effect of blocking external light may be greater to serve a function like a black matrix, and an overlapping structure of two or more color filters may serve a function to prevent color mixing. In this sense, an overlapping structure COS of the color filter may be defined as a light blocking structure.

In addition, a first filter opening B-OP1 corresponding to the first pixel region PXA-R is defined in the third color filter CF-B, and a second filter opening B-OP2 corresponding to the second pixel region PXA-G is defined in the third color filter CF-B. In addition, a first filter opening R-OP1 corresponding to the second pixel region PXA-G is defined in the first color filter CF-R, and a second filter opening R-OP2 corresponding to the third pixel region PXA-B is defined in the first color filter CF-R. A first filter opening G-OP1 corresponding to the first pixel region PXA-R is defined in the second color filter CF-G, and a second filter opening G-OP2 corresponding to the third pixel region PXA-B is defined in the second color filter CF-G.

Two filter openings among the first filter opening B-OP1 and the second filter opening B-OP2 of the third color filter CF-B, the first filter opening R-OP1 and the second filter opening R-OP2 of the first color filter CF-R, and the first filter openings G-OP1 and the second filter openings G-OP2 of the second color filter CF-G overlap around the first pixel region PXA-R, the second pixel region PXA-G, or the third pixel region PXA-B. The two filter openings which overlap may be aligned, but as shown in FIG. 3C, a filter opening formed through a post-process may have a larger area than a filter opening formed through a pre-process.

Referring to FIG. 3C, According to some embodiments, a color filter overlapping structure COS formed in the order of the third color filter CF-B, the first color filter CF-R, and the second color filter CF-G on the second base layer BS2 is shown as an example, but the embodiment of the inventive concept is not necessarily limited thereto. The stack structure of the color filter overlapping structure COS may be altered.

According to some embodiments of the inventive concept, an organic layer OL is located below the first, second, and third color filters CF-R, CF-G, and CF-B. The organic layer OL may be formed to remove a step formed by the first, second, and third color filters CF-R, CF-G, and CF-B and to provide a flat surface.

According to some embodiments of the inventive concept, the organic layer OL may be formed to increase light conversion efficiency. In this case, the organic layer OL may have a relatively low refractive index. Referring to FIG. 3B, the organic layer OL may recycle incident light by totally reflecting light emitted at a high angle among light emitted to an upper portion of the first light control pattern CCF-R to ensure that the light re-enters the first light control pattern CCF-R. The light that is totally reflected by the organic layer OL and re-enters the first light control pattern CCF-R includes source light that is not converted in the first light control pattern CCF-R and the source light reflected by the organic layer OL may be converted in the first light control pattern CCF-R. The recycling effect of the organic layer OL might not be essential in the third pixel region PXA-B, but for manufacturing processes of the organic layer OL, the organic layer OL may overlap all of the first, second, and third pixel regions PXA-R, PXA-G, and PXA-B and the peripheral region NPXA. The manufacturing processes of the organic layer OL will be described later.

The organic layer OL may have a lower refractive index than a first inorganic layer IOL1. The organic layer OL may have a refractive index of about 1.1 to about 1.5. The organic layer OL may have a high transmittance so as not to hinder the progress of light emitted upward from the first light control pattern CCF-R. The organic layer OL may have a high transmittance of 90% or greater.

The organic layer OL may include a base resin and optical particles mixed therewith. For example, the base resin of the organic layer OL may be an acrylic resin, a urethane-based resin, a silicone-based resin, an epoxy-based resin, and the like. The optical particles may be particles for lowering the refractive index of the organic layer OL. The optical particles may include, for example, porogen or hollow silica. As the organic layer OL includes a porous material such as porogen or hollow silica, the organic layer OL may have a refractive index of about 1.5 or less.

The first inorganic layer IOL1 is located below the organic layer OL. The first inorganic layer IOL1 may have a single-layer/multi-layer structure. The first inorganic layer IOL1 may include silicon oxide, silicon nitride, silicon oxynitride, or the like. The first inorganic layer IOL1 may seal the organic layer OL to prevent the organic layer OL from being deformed in a subsequent process. According to some embodiments, an inorganic layer for sealing the first, second, and third color filters CF-R, CF-G, and CF-B may be further located between the organic layer OL and the first, second, and third color filters CF-R, CF-G, and CF-B.

A division pattern BW is located below the first inorganic layer IOL1. The division pattern BW provides first, second, and third openings BW-OP1, BW-OP2, and BW-OP3 corresponding to the first, second, and third pixel regions PXA-R, PXA-G, and PXA-B. According to some embodiments, the division pattern BW is a pattern in black and may be a black matrix. According to some embodiments, the division pattern BW may include a black coloring agent. The black coloring agent may include a black dye and a black pigment. The black coloring agent may include carbon black, a metal such as chromium, or an oxide thereof.

First, second, and third light control patterns CCF-R, CCF-G, and C-B may be located in the first, second, and third openings BW-OP1, BW-OP2, and BW-OP3, respectively. The first, second, and third light control patterns CCF-R, CCF-G, and C-B alter optical properties of source light. The first and second light control patterns CCF-R and CCF-G may generate light of different colors after absorbing the source light. The third light control pattern C-B may transmit and scatter a portion of the incident source light. As such, the third light control pattern C-B serves an optical function different from that of the first and second light control patterns CCF-R and CCF-G.

The first and second light control patterns CCF-R and CCF-G may include a base resin and quantum dots mixed (or dispersed) in the base resin. According to some embodiments, the first and second light control patterns CCF-R and CCF-G may be defined as quantum dot patterns and include different quantum dots. The base resin may be a medium in which quantum dots are dispersed, and may be formed of various resin compositions which may be generally referred to as a binder. However, the embodiment of the inventive concept is not necessarily limited thereto, and in the present description, any medium capable of dispersing quantum dots may be referred to as a base resin regardless of its name, additional other functions, constituent materials, and the like. The base resin may be a polymer resin. For example, the base resin may be an acrylic resin, a urethane-based resin, a silicone-based resin, an epoxy-based resin, and the like. The base resin may be a transparent resin.

Quantum dots may be particles converting the wavelength of incident light. The quantum dots have a crystalline structure of a few nanometers in size, contains hundreds to thousands of atoms, and exhibits a quantum confinement effect in which an energy band gap is increased due to its small size. When light of a wavelength having higher energy than the band gap is incident on the quantum dots, the quantum dots absorb the light to be excited, and falls to a ground state while emitting light of a specific wavelength. The emitted light of the specific wavelength has a value corresponding to the band gap. When the quantum dots are adjusted in size and composition, light emitting properties due to the quantum confinement effect may be controlled.

The quantum dots may be selected from a Group II-VI compound, a Group III-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of AgInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group compound may include a ternary compound selected from the group consisting of $AgInS_2$, $CuInS_2$, $AgGaS_2$, $CuGaS_2$, or any mixture thereof, or a quaternary compound such as $AgInGaS_2$ and $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. Meanwhile, the Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In this case, the binary compound, the ternary compound, or the quaternary compound may be present in particles having a uniform concentration distribution, or may be present in the same particles having a partially different concentration distribution.

The quantum dots may have a core-shell structure including a core and a shell surrounding the core. In addition, a core/shell structure in which one quantum dot surrounds another quantum dot may be present. An interface between a core and a shell may have a concentration gradient in which the concentration of an element present in a shell becomes lower towards the core.

The quantum dots have a size of a few nanometers. The quantum dots may have a full width of half maximum (FWHM) of a light emitting wavelength spectrum of about 45 nm or less, preferably about 40 nm or less, more preferably about 30 nm or less, and color purity or color reproducibility may be enhanced in the above ranges. In addition, light emitted through such quantum dots is emitted in all directions, and thus a wide viewing angle may be improved.

In addition, the form of quantum dots is not particularly limited as long as it is a form commonly used in the art, but more specifically, a quantum dot in the form of spherical, pyramidal, multi-arm, or cubic nanoparticles, nanotubes, nanowires, nanofibers, nanoplatelets, etc. may be used. The quantum dots may control the color of emitted light according to particle size thereof, and thus the quantum dots may have various colors of emitted light such as res light, green light, blue light, and the like.

According to some embodiments, the first light control pattern CCF-R may be a red quantum dot pattern generating red light after absorbing source light, and the second light control pattern CCF-G may be a green quantum dot pattern generating green light after absorbing source light. The first light control pattern CCF-R and the second light control pattern CCF-G may further include scatterers.

The third light control pattern C-B may include a base resin and scatterers mixed (or dispersed) in the base resin. The third light control pattern C-B may be a scattering pattern that scatters source light. The scatterers may be particles having a relatively large density or specific gravity. The scattering particles may include titanium oxide ($TiO_2$) or silica-based nanoparticles.

A second inorganic layer IOL2 is located below the division pattern BW and the first, second, and third light control patterns CCF-R, CCF-G, and C-B. The second inorganic layer IOL2 may have a single-layer/multi-layer structure. The second inorganic layer IOL2 may include silicon oxide, silicon nitride, silicon oxynitride, or the like. The second inorganic layer IOL2 may seal the division pattern BW, and the first, second, and third light control patterns CCF-R, CCF-G, and C-B to prevent the division pattern BW, and the first, second, and third light control patterns CCF-R, CCF-G, and C-B from being damaged.

Figure 4A:
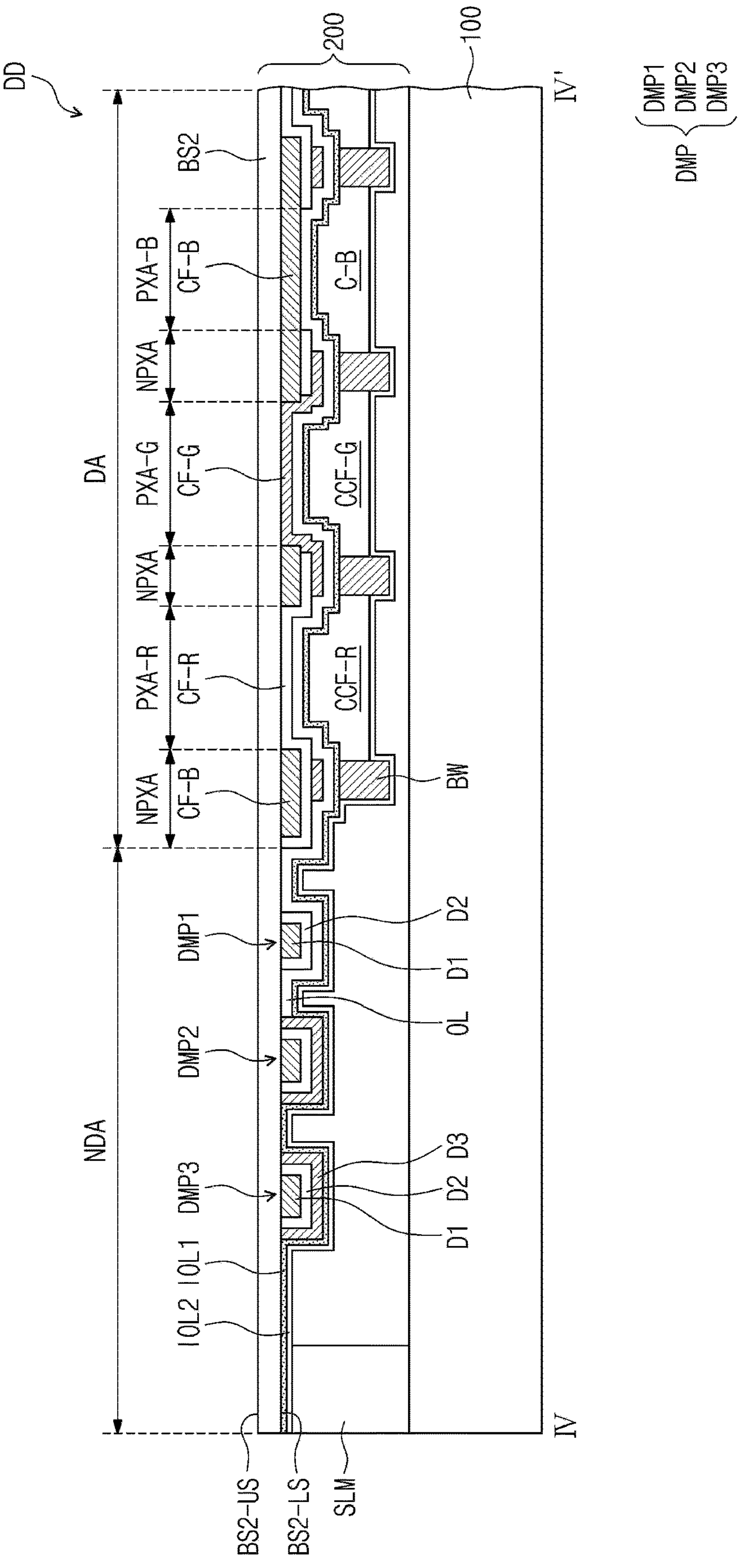
FIG. 4A is a cross-sectional view of a display device according to some embodiments of the inventive concept.
Figure 4B:
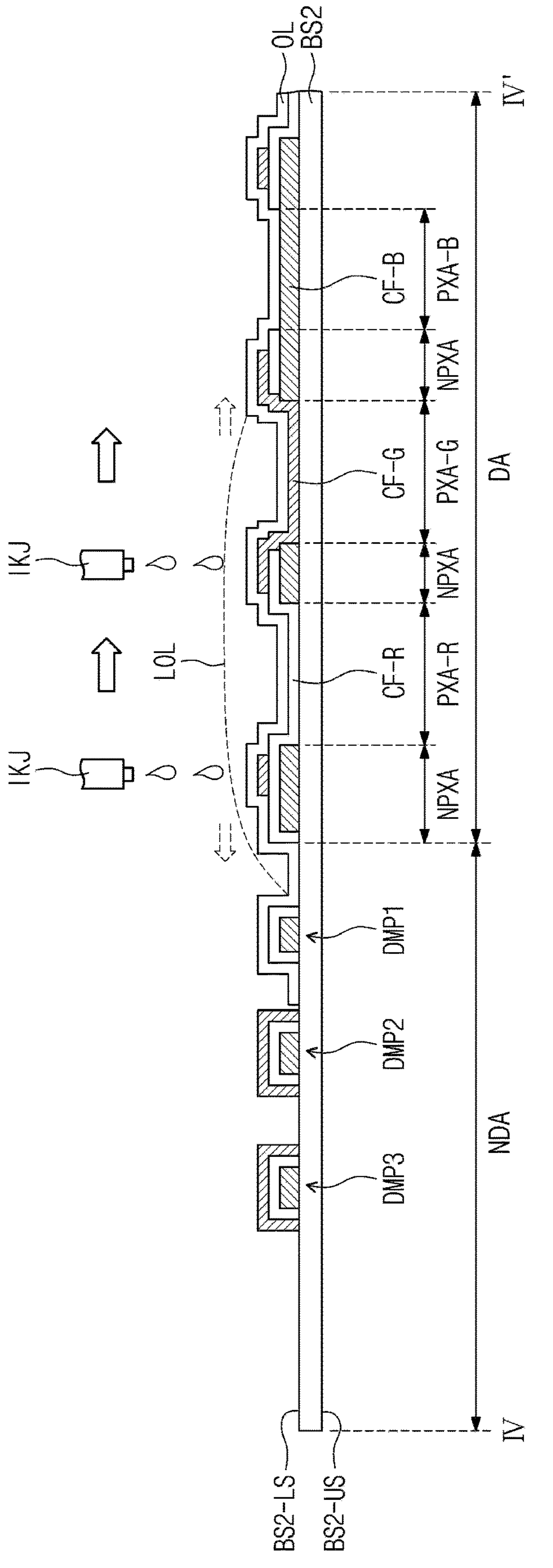
FIGS. 4B and 4C are cross-sectional views showing a method for manufacturing a second display substrate according to some embodiments of the inventive concept.
Figure 4C:
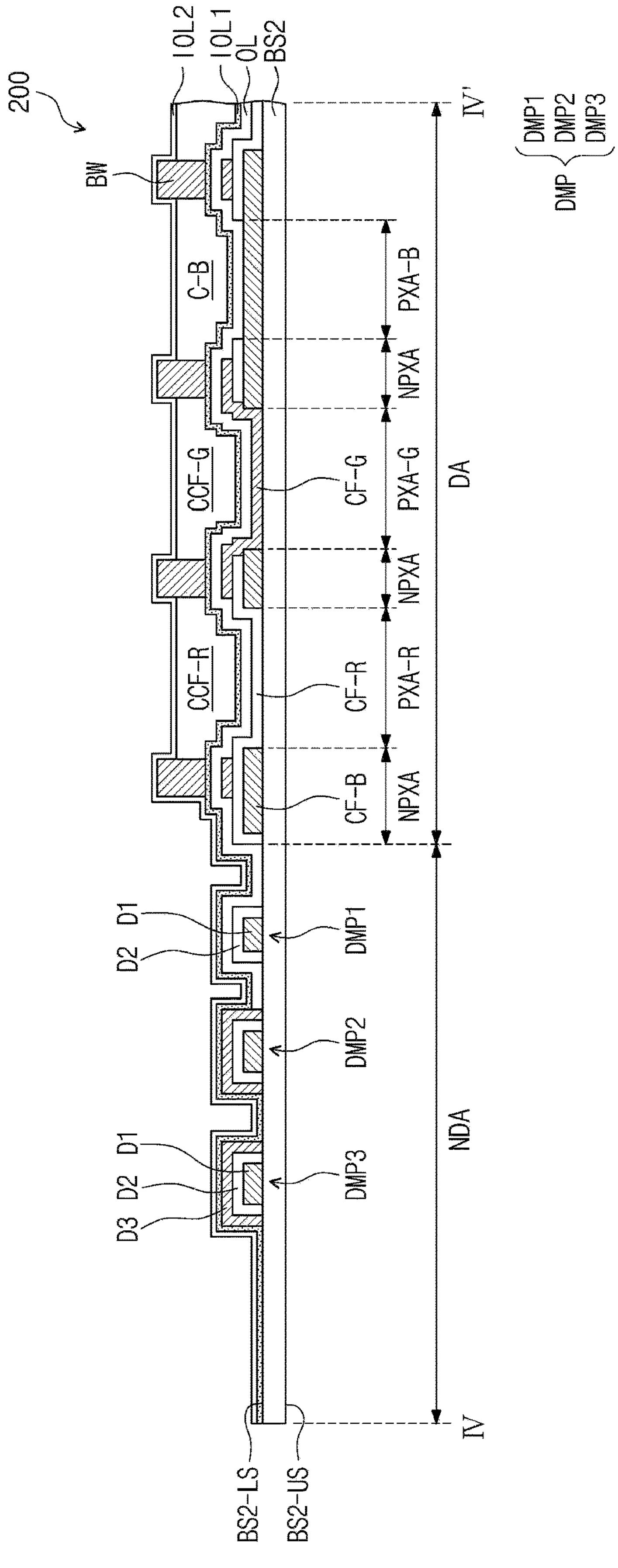
Figure 4D:
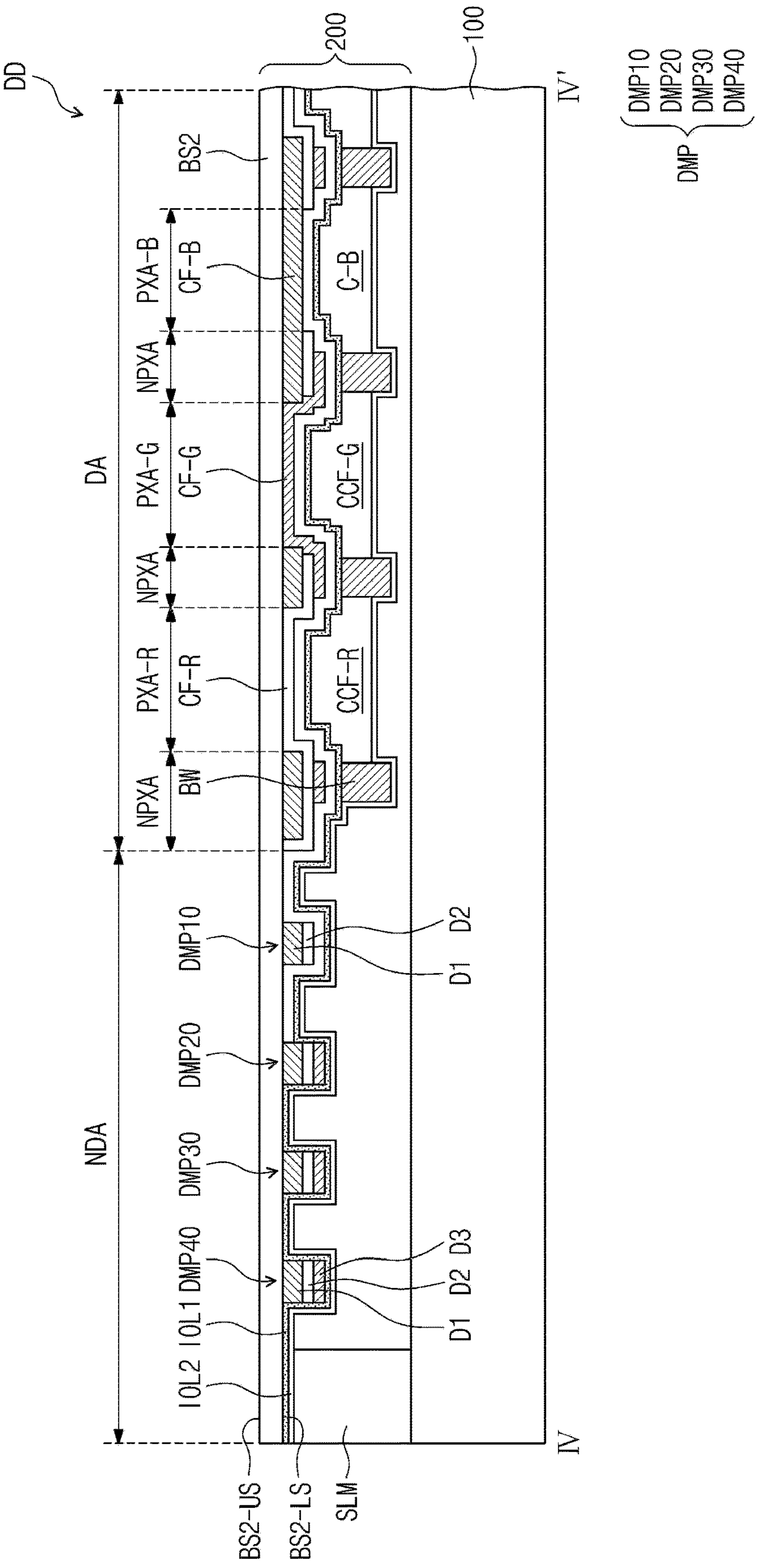
FIGS. 4D and 4E are cross-sectional views of a display device according to some embodiments of the inventive concept.
Figure 4E:
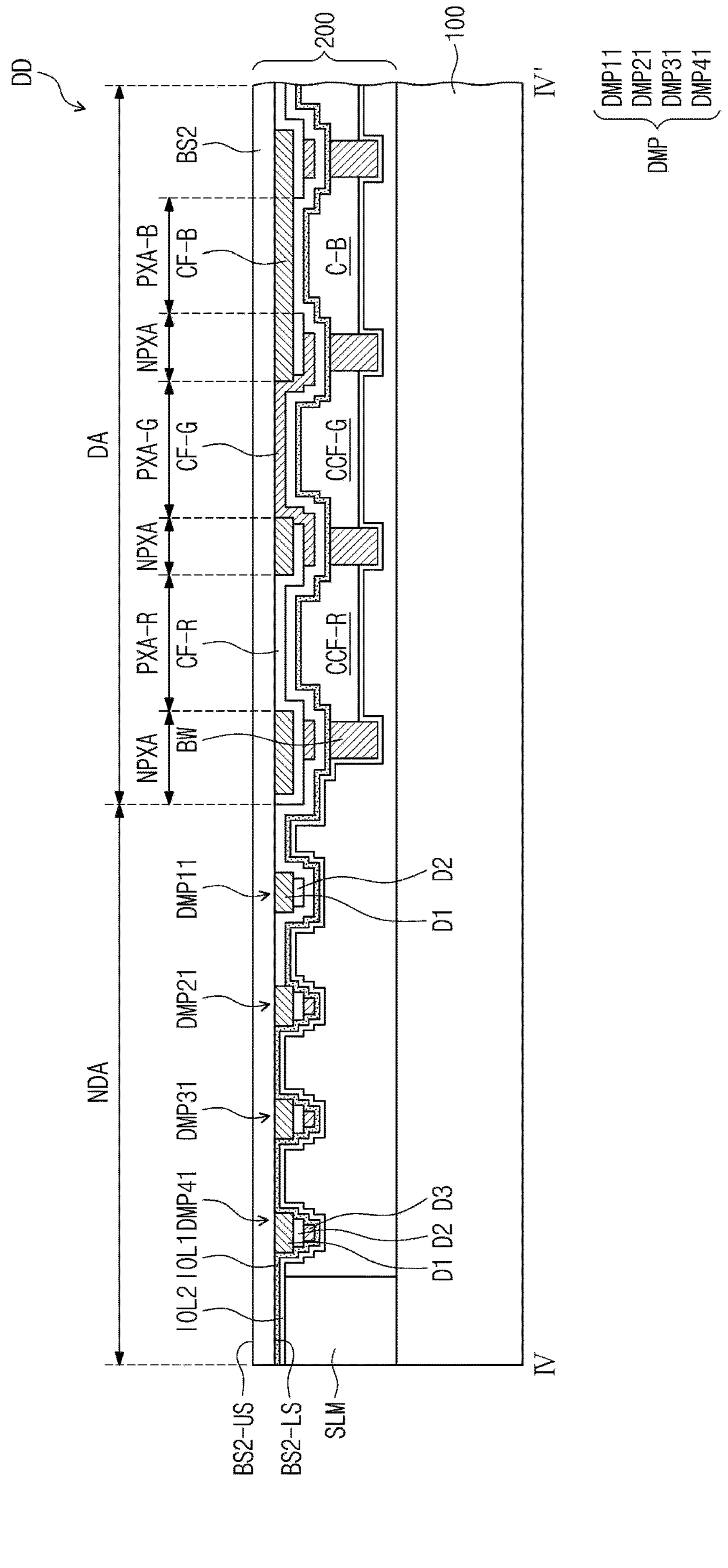

FIG. 4A is a cross-sectional view of a display device DD according to some embodiments of the inventive concept. FIGS. 4B and 4C are cross-sectional views showing a method for manufacturing a second display substrate 200 according to some embodiments of the inventive concept. FIGS. 4D and 4E are cross-sectional views of a display device DD according to some embodiments of the inventive concept. Hereinafter, detailed descriptions of the configuration described with reference to FIGS. 1A to 3C will be omitted.

FIG. 4A is a cross-section corresponding to IV-IV' of FIG. 1B, and the first display substrate 100 is schematically shown. The sealing member SLM is bonded to the first display substrate 100, and the sealing member SLM may contact a portion extending to the non-display region NDA of an uppermost inorganic layer of the thin film encapsulation layer TFE shown in FIG. 3B. Alternatively, the sealing member SLM may contact a portion extending to the non-display region NDA of an uppermost inorganic layer (e.g., the second insulating layer 20) of the thin film encapsulation layer TFE shown in FIG. 3B. For detailed descriptions of the display region DA of the second display substrate 200 shown in FIG. 4A, see FIGS. 3B and 3C.

Referring to FIG. 4A, a plurality of dam patterns DMP overlapping the non-display region NDA are located on a lower surface BS2-LS of the second base layer BS2. The number of dam patterns DMP is not particularly limited. The dam patterns DMP may include first to n-th dam patterns (where n is a natural number of 2 or greater) arranged to be gradually further distant from the display region DA. That is, the space or gap between adjacent dam patterns increases the further they are from the display region DA. According to some embodiments, first to third dam patterns DMP1, DMP2, and DMP3 are shown as an example. Hereinafter, the third dam pattern DMP3 indicates the n-th dam pattern, and the description of the third dam pattern DMP3 replaces the description of the n-th dam pattern.

The first to third dam patterns DMP1, DMP2, and DMP3 may have a closed line shape when viewed on a plane as shown in FIG. 1B. The first to third dam patterns DMP1, DMP2, and DMP3 may have the same structure or different structures.

The first to third dam patterns DMP1, DMP2, and DMP3 control flow of a liquid organic material in processes of manufacturing the organic layer OL. Detailed descriptions thereof will be given later. The organic layer OL overlaps the display region DA and the non-display region NDA. For processes which will be described later, an edge of the organic layer OL is located inside the n-th dam pattern (or an outermost dam pattern), which is, According to some embodiments, inside the third dam pattern DMP3. Accordingly, the edge of the organic layer OL is located inside the third dam pattern DMP3 and is located between the n dam patterns. As shown in FIG. 4A, the edge of the organic layer OL may be located between the first dam pattern DMP1 and the second dam pattern DMP2.

The plurality of dam patterns DMP may have a multi-layer structure. Each of the first to third dam patterns DMP1, DMP2, and DMP3 may include the same material as the color filters CF-R, CF-G, and CF-B. According to some embodiments, the first dam pattern DMP1 and the second dam pattern DMP2 including a first layer D1 of the same material as the third color filter CF-B, a second layer D2 of the same material as the first color filter CF-R, and a third layer D3 made of the same material as the second color filter CF-G are shown as an example. In the manufacturing process of sequentially forming the third color filter CF-B, the first color filter CF-R, and the second color filter CF-G, the first layer D1 and the second layer D2, and the third layer D3 may be sequentially formed. The manufacturing process of the third color filter CF-B may include a coating process of a preliminary color filter layer, a photo process of a preliminary color filter layer, and an etching process of a preliminary color filter layer. The first layer D1 may be concurrently with the third color filter CF-B in the manufacturing process of the third color filter CF-B.

As shown in FIG. 4A, the second layer D2 may be located below the first layer D1 and may surround a side surface of the first layer D1. The third layer D3 may be located below the second layer D2 and may surround a side surface of the second layer D2.

The first inorganic layer IOL1 and the second inorganic layer IOL2 overlap the plurality of dam patterns DMP and seal the plurality of dam patterns DMP and the organic layer OL. The first inorganic layer IOL1 and the second inorganic layer IOL2 formed through deposition are entirely formed on the lower surface BS2-LS of the second base layer BS2, and extend outside the n-th dam pattern among the plurality of dam patterns DMP.

The sealing member SLM is located outside the n-th dam pattern, and the sealing member SLM overlaps the first inorganic layer IOL1 and the second inorganic layer IOL2. The organic layer OL is not located between the sealing member SLM and the second base layer BS2. The second base layer BS2, the first inorganic layer IOL1, the second inorganic layer IOL2, and the sealing member SLM are closely bonded to each other so that a path into which moisture is introduced from the outside of the display device DD to the inside of the display device DD is not provided. Because the organic layer OL is not located in the region where the sealing member SLM is located, the path into which moisture is introduced is removed. Moisture introduced into the display device DD causes corrosion of signal lines, short circuit of signal lines, and swelling of an organic layer, and such defects may be prevented in the display device DD according to some embodiments of the inventive concept.

FIGS. 4B and 4C show some processes for manufacturing the second display substrate 200. The second base layer BS2 shown in FIG. 4B is in a state in which the second base layer BS2 of FIG. 4A is inverted. That is, the lower surface BS2-LS of FIG. 4A corresponds to an upper surface in FIG. 4B, and the upper surface BS2-US of FIG. 4A corresponds to a lower surface in FIG. 4B.

Referring to FIG. 4B, the first to third color filters CF-R, CF-G, and CF-B and the first to third Dam patterns DMP1, DMP2, and DMP3 are formed on one surface BS-LS of the second base layer BS2. As described above, in the manufacturing process of the first to third color filters CF-R, CF-G, and CF-B, the first to third dam patterns DMP1, DMP2, and DMP3 may be concurrently formed.

Thereafter, the organic layer OL is formed. In FIG. 4B, a liquid organic material LOL provided from an inkjet head IKL is shown in dotted line. In addition, FIG. 4 shows the cured organic layer OL overlapping the liquid organic material LOL. With the inkjet head IKL moving, the liquid organic material LOL is provided in the display region DA, and the liquid organic material LOL provided in the display region DA flows towards the non-display region NDA. The liquid organic material LOL reaches the first dam pattern DMP1, and the first dam pattern DMP1 reduces flow velocity of the liquid organic material LOL.

According to some embodiments, the first dam pattern DMP1 is set to have a lower height than the other dam patterns DMP2 and DMP3 to ensure that the liquid organic material LOL overflows the first dam pattern DMP1 more easily. When the flow of the liquid organic material LOL is terminated inside the first dam pattern DMP1 and the liquid organic material LOL is cured, the organic layer OL has a relatively large thickness around the first dam pattern DMP1. When a portion of the organic layer OL having a relatively large thickness is located adjacent to the display region DA, source light or converted light may be reflected from the portion of the organic layer OL towards a specific region. This causes defects in which light is concentrated on the specific region. According to some embodiments, because the organic layer OL has a thickness that is not greater than that of other regions around the first dam pattern DMP1, such defects may be prevented.

At least, the third dam pattern DMP3 may have a closed line shape (or a continuous-line shape). As a dam pattern having a closed line shape increases among the plurality of dam patterns DMP1, DMP2, and DMP3, an area in which a liquid organic material spreads in the non-display region NDA, which will be described later, decreases.

Referring to FIG. 1B, any one of the dam patterns DMP may include a first extension portion and a second extension portion facing in the first direction DR1 and each extending in the second direction DR2, and a first extension portion and a second extension portion facing in the second direction DR2 and each extending in the first direction DR1. The first to fourth extension portions may be located to be spaced apart from each other, which may be defined as an intermittent-line shape. The dam pattern DMP may include a plurality of portions. The intermittent-line shape indicates a shape in which a plurality of portions are arranged to define a shape similar to a closed line as a whole, but a shape in which adjacent portions are spaced apart to allow a liquid organic material to pass through the spaced region. As the proportion of the intermittent-line-shaped dam pattern to the plurality of dam patterns DMP increases, the area in which the liquid organic material spreads increases. As such, an occupied area of the organic layer OL and a thickness in the non-display region NDA may be controlled by regulating the shape and height of the plurality of dam patterns DMP1, DMP2, and DMP3.

Although the organic layer OL formed through the inkjet process and the curing process has been described as an example with reference to FIG. 4B, a method of forming the organic layer OL is not particularly limited. However, the organic layer OL formed through the inkjet process and the curing process may not include a photosensitive material. The organic layer OL having a low refractive index may be formed without developing a photosensitive material, and the process is performed without a photo process and an etching process, and thus a mask may be omitted, thereby reducing costs for forming the organic layer OL.

As shown in FIG. 4C, after the organic layer OL is formed, the first inorganic layer IOL1 may be formed on an entire surface of the second base layer BS2 using a deposition process. Thereafter, the division pattern BW may be formed through a process of forming a preliminary division pattern layer, a photo process of a preliminary division pattern layer, and an etching process of a preliminary division pattern layer. The first, second, and third light control patterns CCF-R, CCF-G, and C-B may be sequentially formed through a manufacturing process similar to that of the division pattern BW. In addition, the second inorganic layer IOL2 may be formed on the entire surface of the second base layer BS2 using a deposition process.

FIG. 4D shows first to fourth dam patterns DMP10 to DMP40, and FIG. 4E shows the first to fourth dam patterns DMP10 to DMP40 of FIG. 4D and first to fourth dam patterns DMP11 to DMP41 having a different structure. Hereinafter, detailed descriptions of the same configuration and effects as the configuration described with reference to FIGS. 4A to 4C will be omitted.

Referring to the first dam pattern DMP10 of FIG. 4D, the first layer D1 and the second layer D2 have the same width. Referring to the second to fourth dam patterns DMP20 to DMP40, the first layer D1 to the third layer D3 have the same width. Edges of the first layer D1 to the third layer D3 may be aligned with each other.

Referring to the first dam pattern DMP11 of FIG. 4E, the first layer D1 and the second layer D2 have different widths. Referring to the second to fourth dam patterns DMP21 to DMP41, the first layer D1 to the third layer D3 have different widths. The first layer D1 to the third layer D3 are formed through different processes, and a layer formed through a post-process has a smaller width than a layer formed through a pre-process. Because the dam pattern DMP of FIG. 4E has a smoother profile than the dam pattern DMP of FIG. 4D in a cross-section, the effect of preventing a liquid organic material from spreading is relatively low. As such, an occupied area of the organic layer OL may be controlled by altering a structure of a dam pattern.

Referring to FIGS. 4C to 4E, a plurality of dam patterns have the same stack structure, but the embodiment of the inventive concept is not limited thereto. For example, one of the plurality of dam patterns may have a stack structure shown in FIG. 4C, another dam pattern may have a stack structure shown in FIG. 4D, and the other dam pattern may have a stack structure shown in FIG. 4E.

Figure 5A:
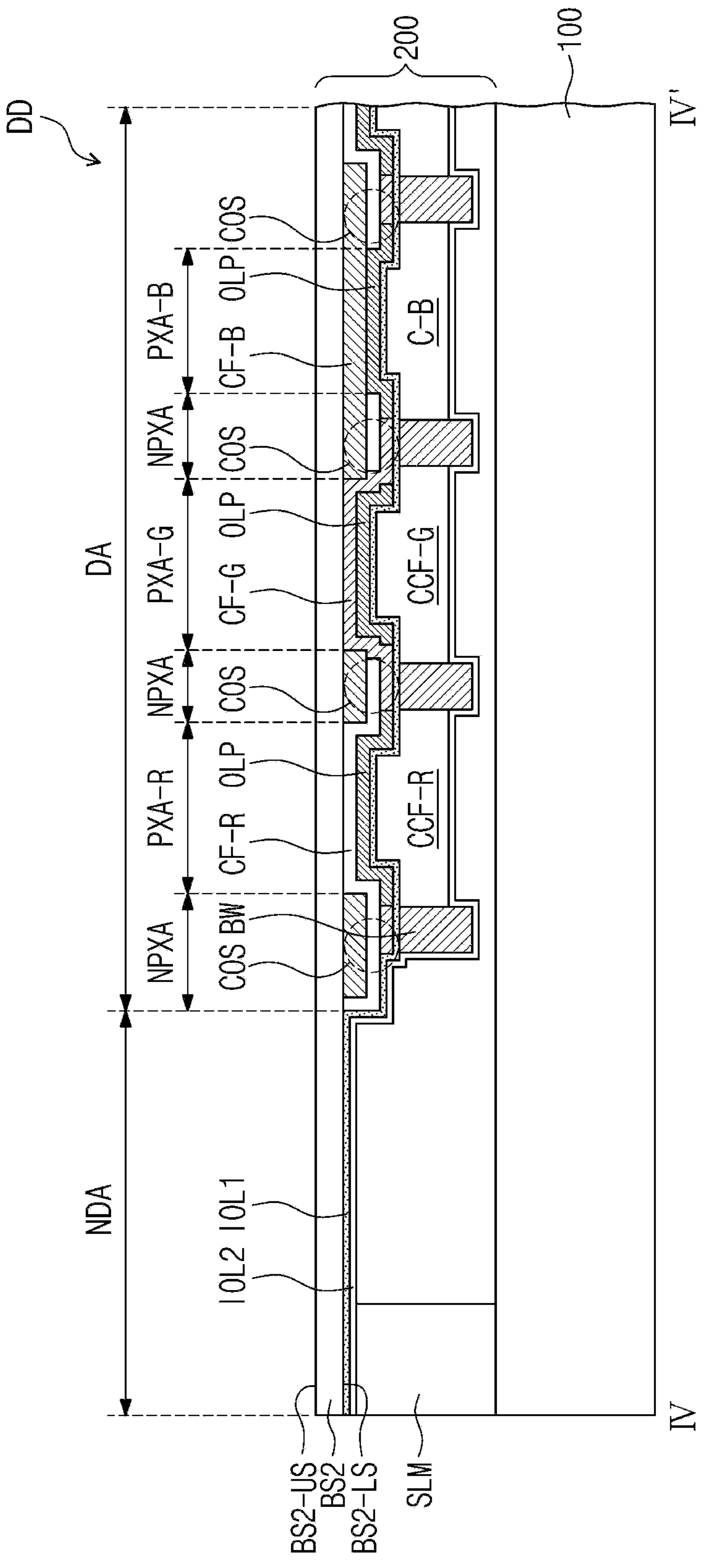
FIG. 5A is a cross-sectional view of a display device according to some embodiments of the inventive concept.
Figure 5B:
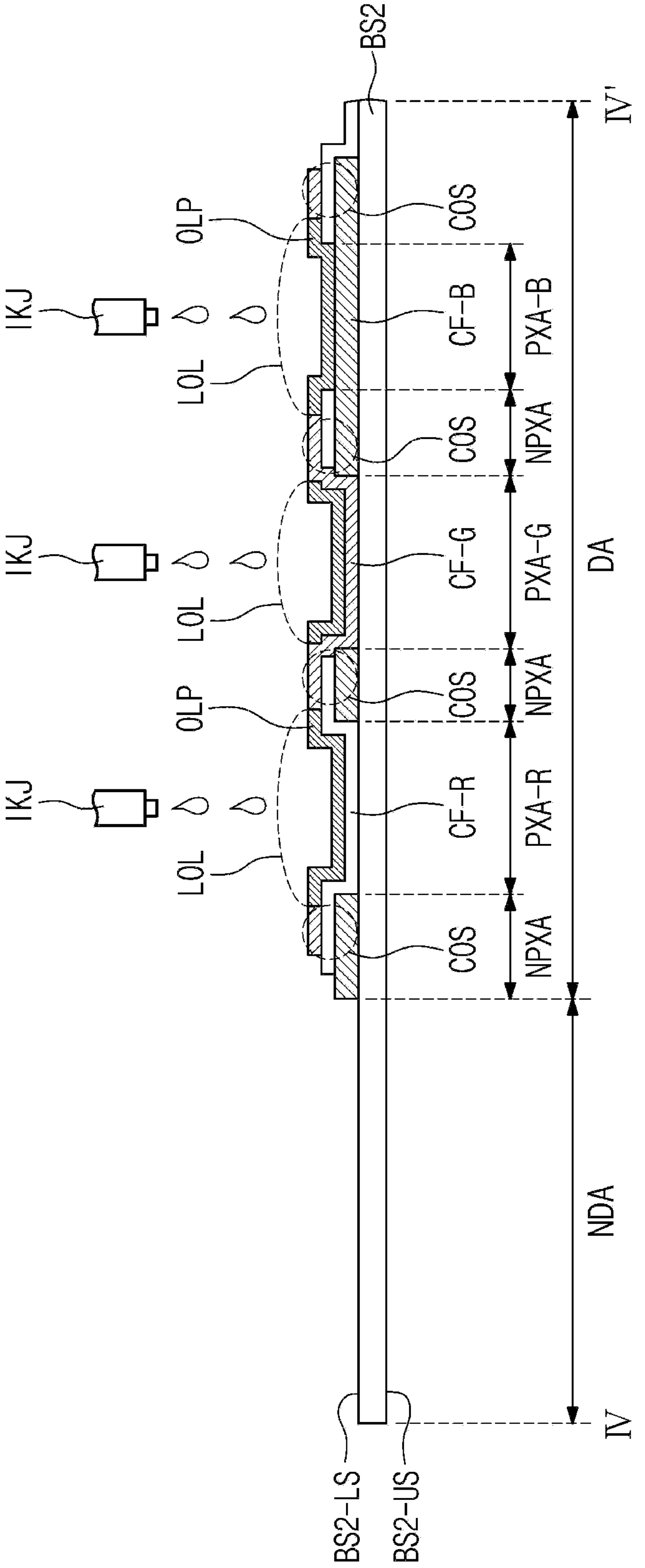
FIGS. 5B and 5C are cross-sectional views showing a method for manufacturing a second display substrate according to some embodiments of the inventive concept.
Figure 5C:
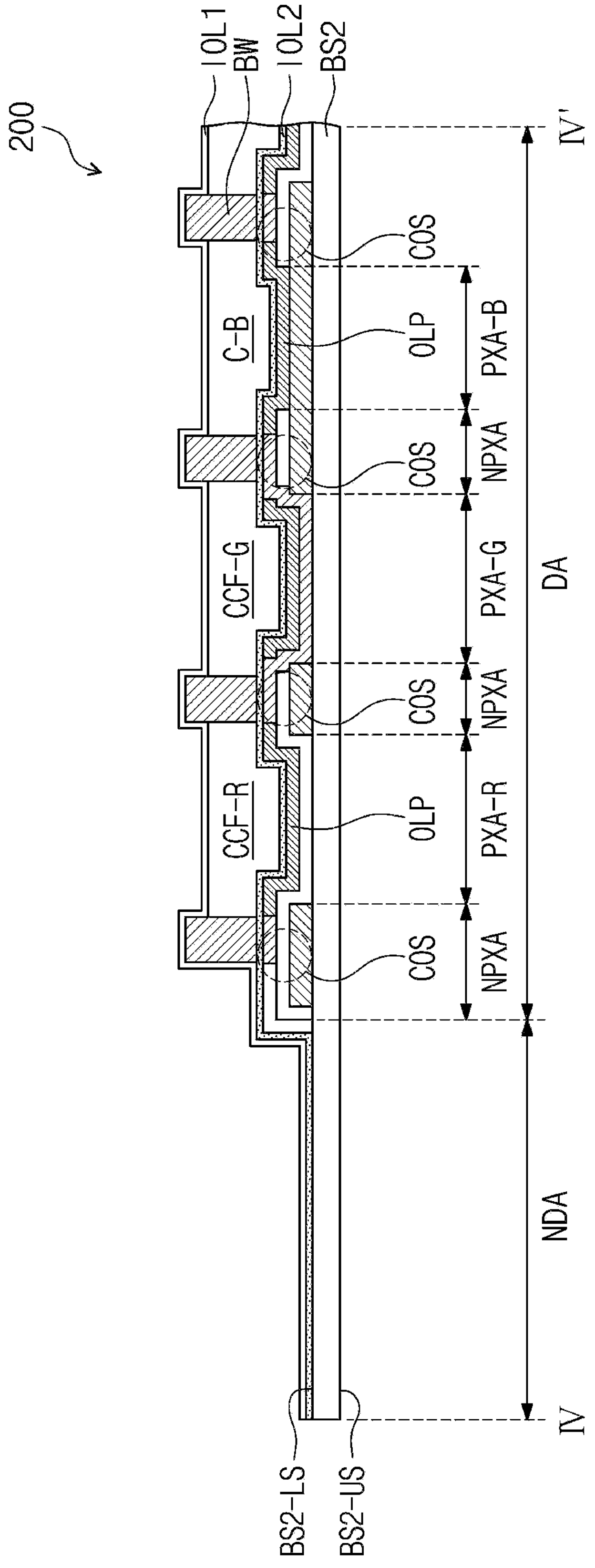

FIG. 5A is a cross-sectional view of a display device DD according to some embodiments of the inventive concept. FIGS. 5B and 5C are cross-sectional views showing a method for manufacturing a second display substrate 200 according to some embodiments of the inventive concept. Hereinafter, descriptions overlapping the one for configuration described with reference to FIGS. 4A to 4C will be omitted.

In the display device DD shown in FIG. 5A, the dam pattern DMP shown in FIG. 4A is omitted. According to some embodiments, the organic layer OL of FIG. 4A is replaced with organic patterns OLP. Because the organic layer OL is not located in the non-display region NDA, a dam pattern for controlling the spread of a liquid organic material in the manufacturing process may be omitted.

The organic patterns OLP each overlap the first, second, and third pixel regions PXA-R, PXA-G, and PXA-B. The organic patterns OLP non-overlap the peripheral region NPXA.

Referring to FIG. 5B, an overlapping structure COS of a color filter having a relatively larger thickness than the color filters CF-R, CF-G, and CF-B located in the first, second, and third pixel regions PXA-R, PXA-G, and PXA-B overlaps the peripheral region NPXA, and accordingly, a step is formed between the first, second, and third pixel regions PXA-R, PXA-G, and PXA-B and the peripheral region NPXA. It is seen that a cavity or a groove is defined in each of the first, second, and third pixel regions PXA-R, PXA-G, and PXA-B.

As shown in FIG. 5B, the liquid organic material LOL may be provided from the inkjet head IKL only to the first, second, and third pixel regions PXA-R, PXA-G, and PXA-B. As described above, the cavity or the groove are defined in the first, second, and third pixel regions PXA-R, PXA-G, and PXA-B, and the liquid organic material LOL may thus be provided only to the first, second, and third pixel regions PXA-R, PXA-G, and PXA-B. Through a curing process, the organic patterns OLP may be formed as shown in FIG. 5B.

The process shown in FIG. 5C may be substantially the same as the process described with reference to FIG. 4C. The first inorganic layer IOL1 and the second inorganic layer IOL2 are formed to overlap the non-display region NDA. The organic layer OL is not located between the sealing member SLM and the second base layer BS2. The second base layer BS2, the first inorganic layer IOL1, the second inorganic layer IOL2, and the sealing member SLM are closely bonded to each other so that a path into which moisture is introduced from the outside of the display device DD to the inside of the display device DD is not provided. As the dam patterns DMP are not located in the non-display region NDA, an area of the non-display region NDA may be reduced. This is because an area in which the dam patterns DMP are to be formed in the non-display region NDA is in no need of being secured.

Figure 6A:
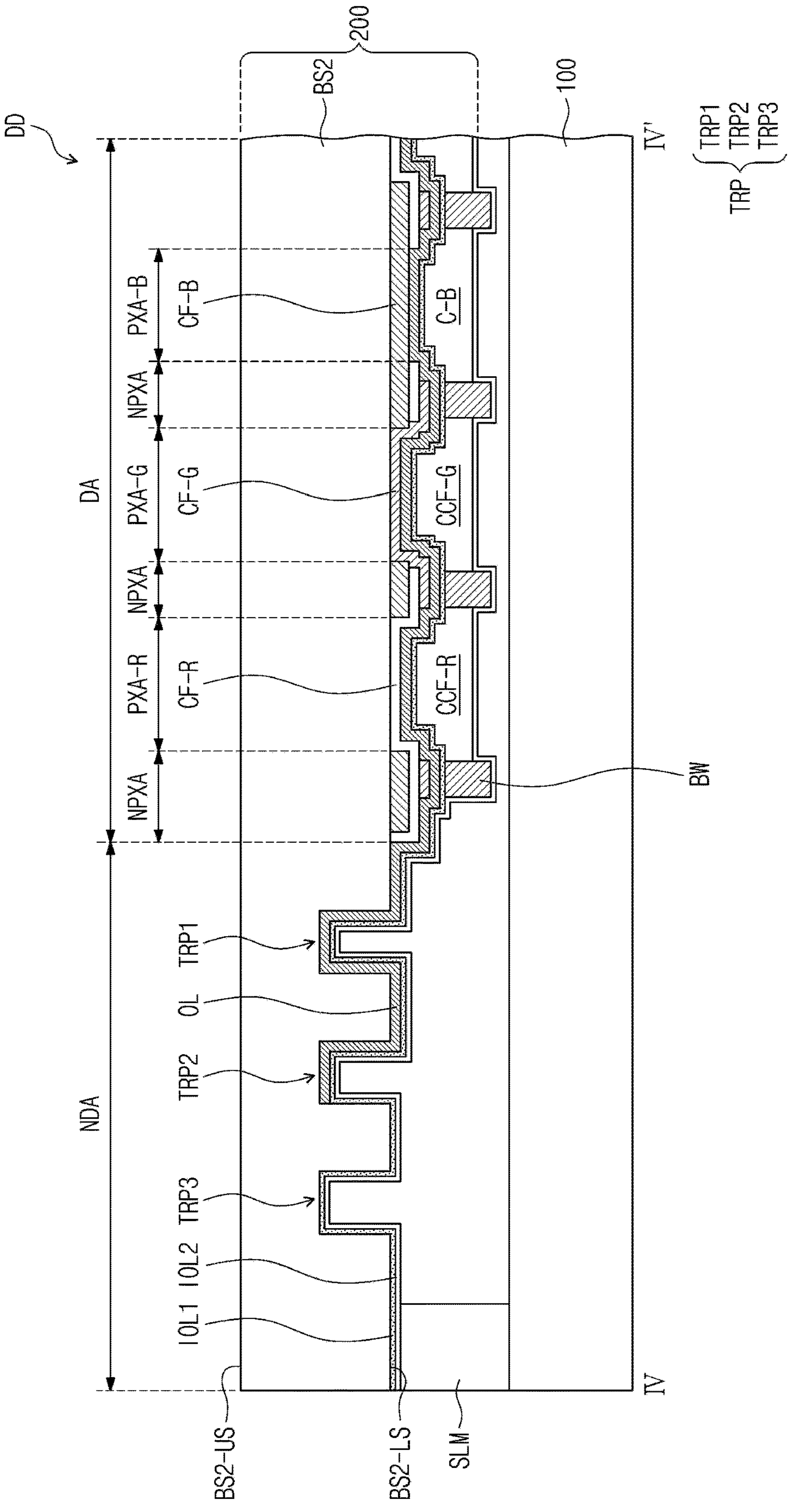
FIG. 6A is a cross-sectional view of a display device according to some embodiments of the inventive concept.
Figure 6B:
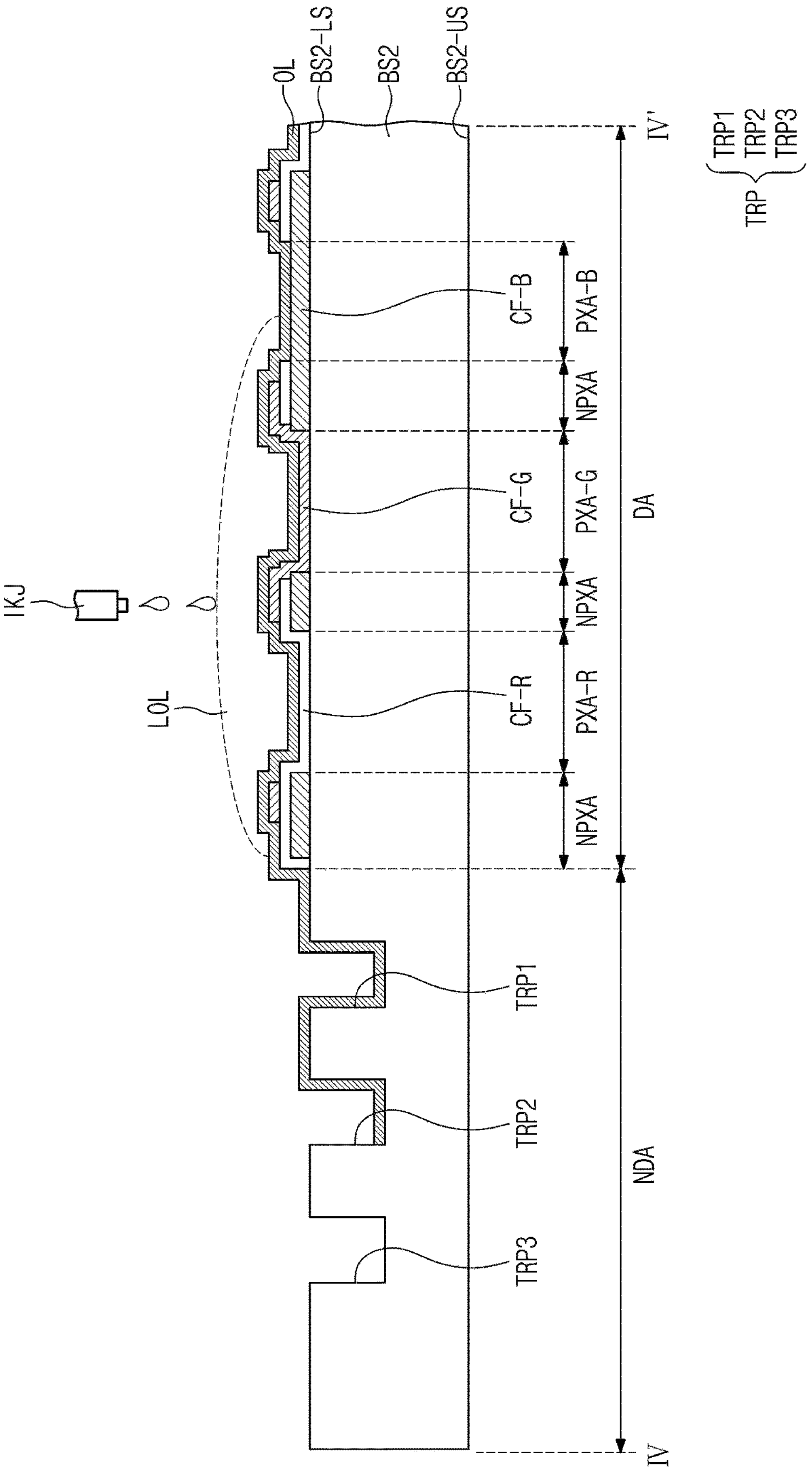
FIGS. 6B and 6C are cross-sectional views showing a method for manufacturing a second display substrate according to some embodiments of the inventive concept.
Figure 6C:
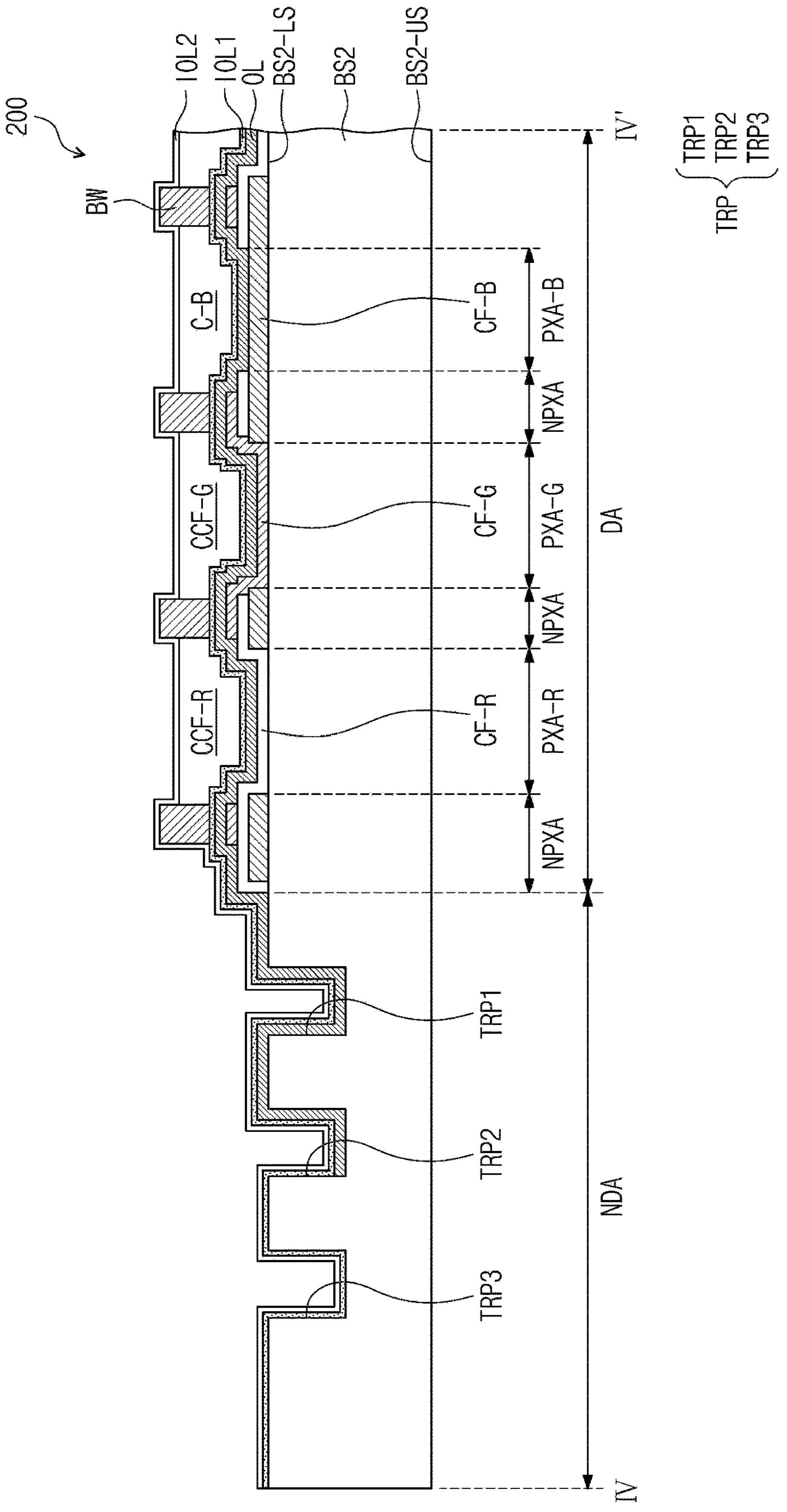
Figure 6D:
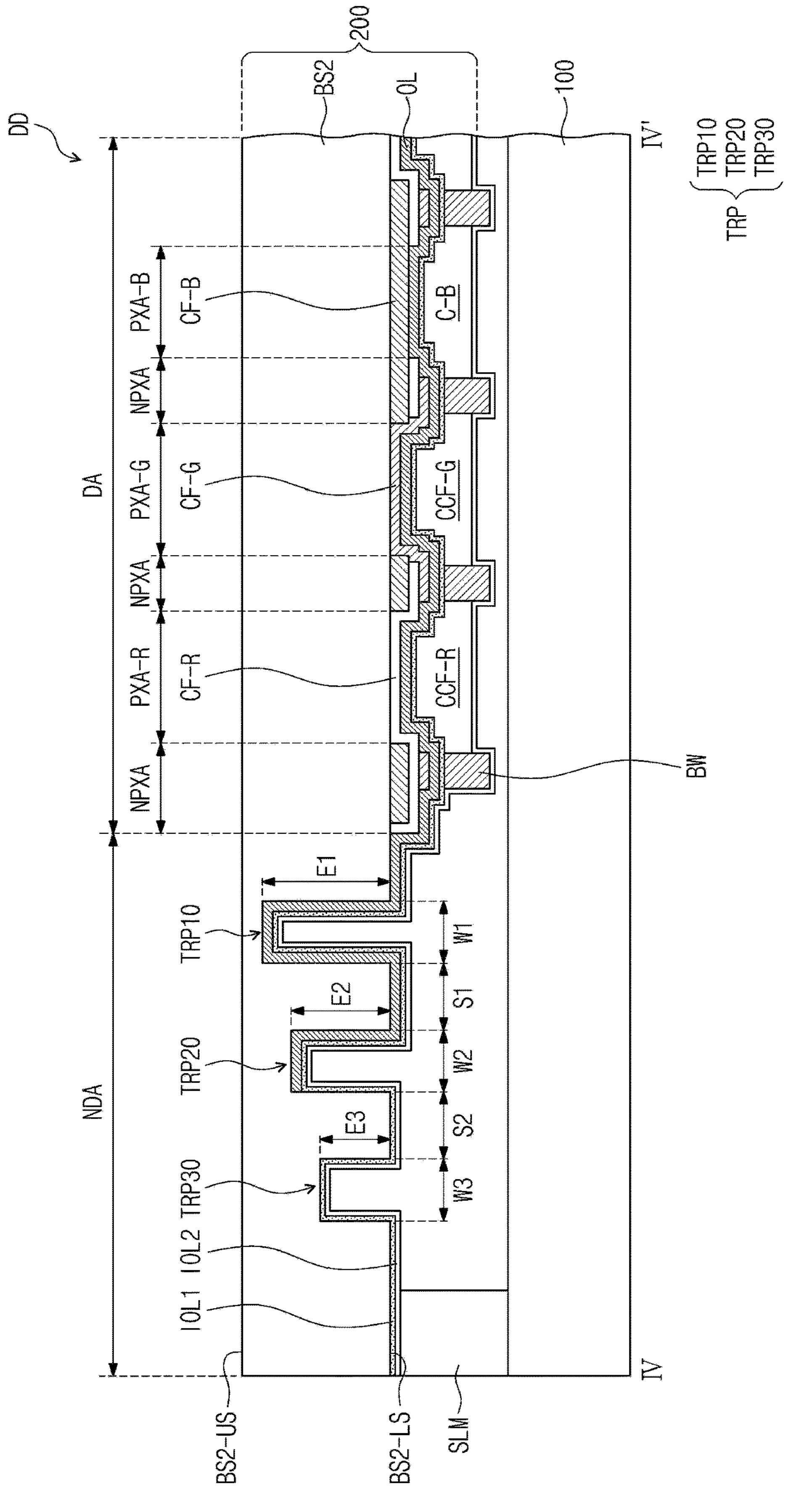
FIGS. 6D to 6F are cross-sectional views of a display device according to some embodiments of the inventive concept.
Figure 6E:
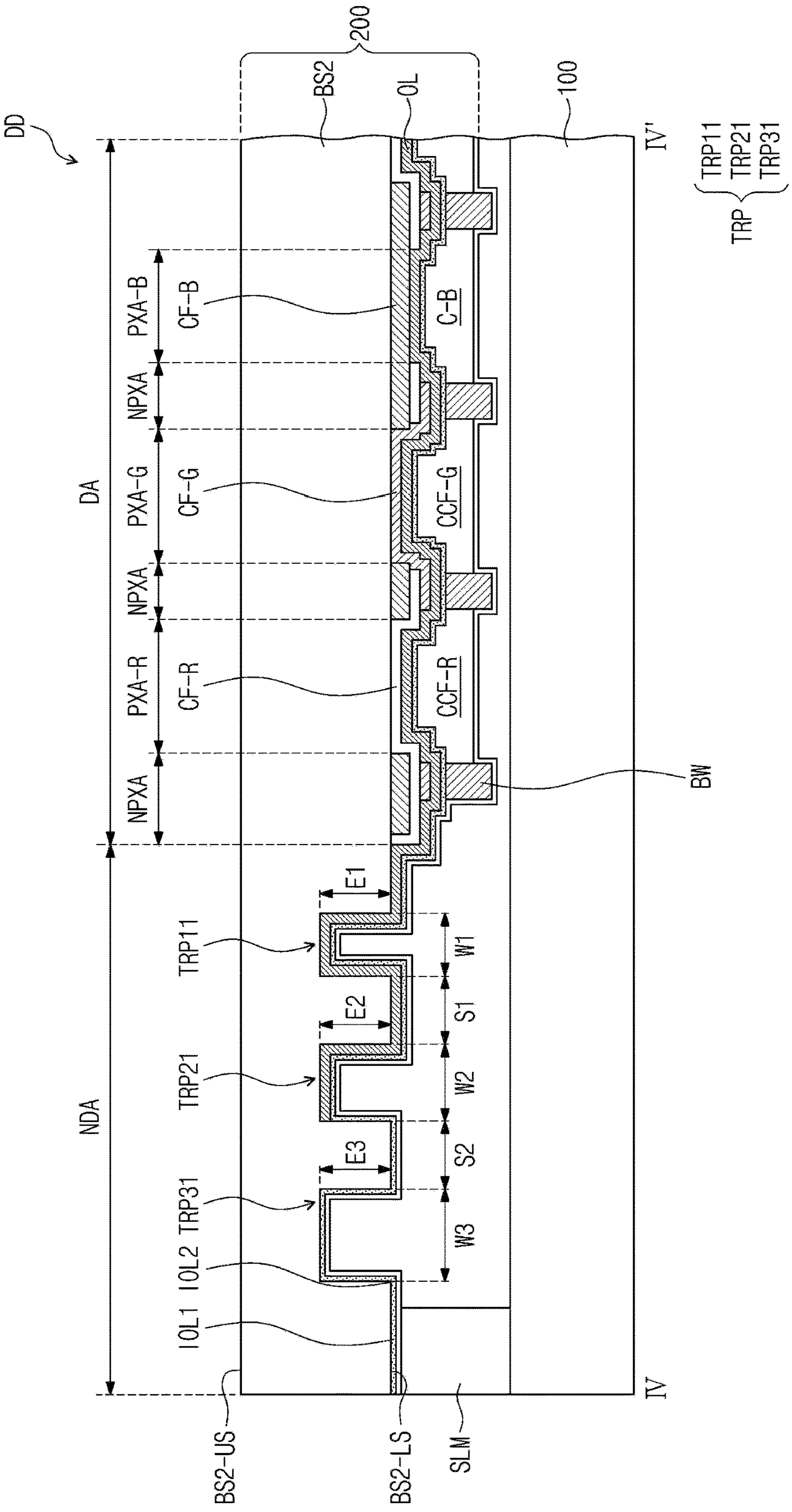
Figure 6F:
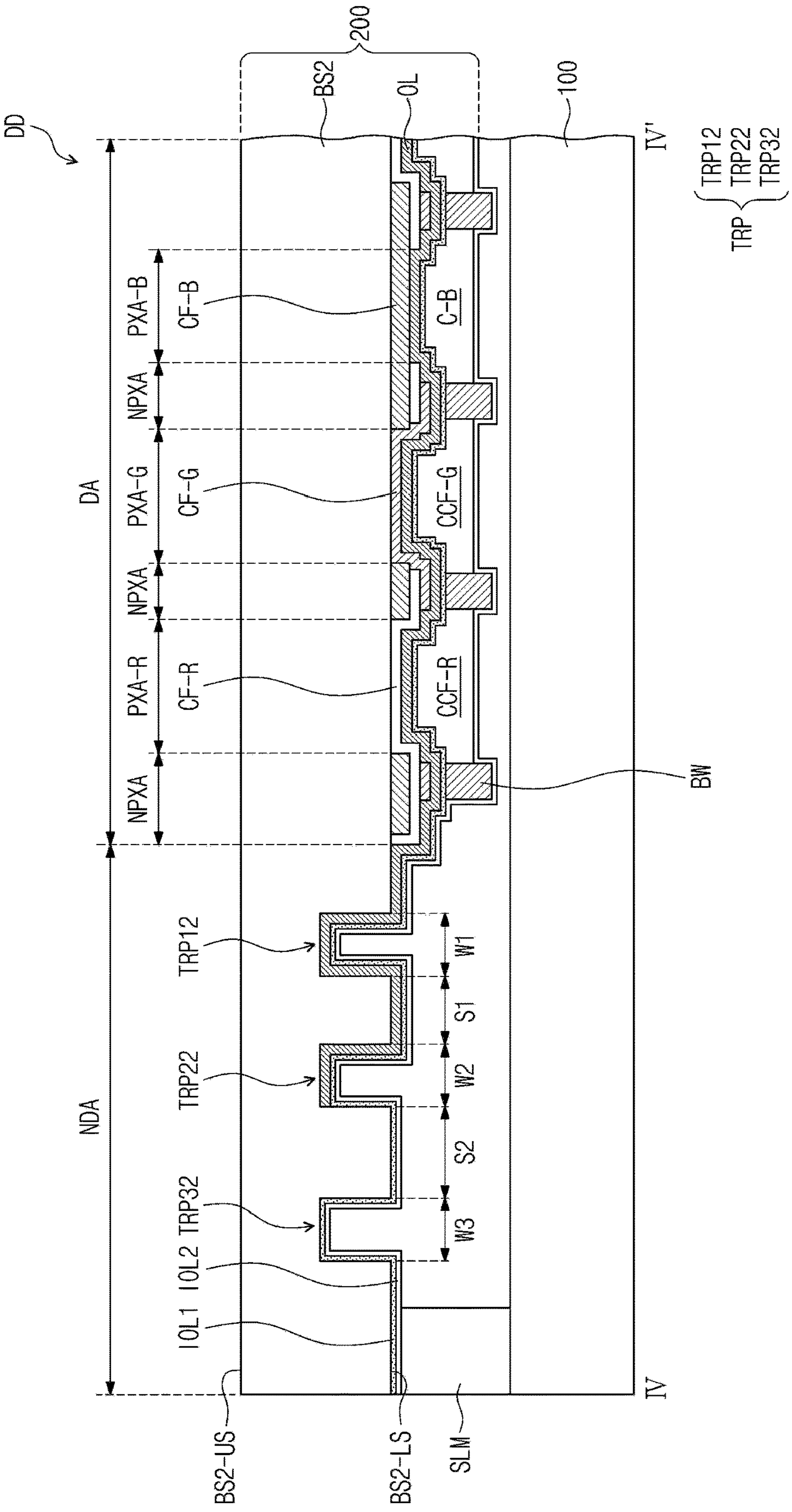

FIG. 6A is a cross-sectional view of a display device DD according to some embodiments of the inventive concept. FIGS. 6B and 6C are cross-sectional views showing a method for manufacturing a second display substrate 200 according to some embodiments of the inventive concept. FIGS. 6D to 6F are cross-sectional views of a display device DD according to some embodiments of the inventive concept. Hereinafter, descriptions overlapping the one for configuration described with reference to FIGS. 1A to 4E will be omitted.

According to some embodiments, a trench pattern TRP replaces the dam pattern DMP described with reference to FIGS. 4A to 4E. The trench pattern TRP corresponds to an intaglio dam pattern and serves a function similar to that of the dam pattern DMP described with reference to FIGS. 4A to 4E. Referring to FIGS. 6A to 6C, the trench pattern TRP may control flow of a liquid organic material in the manufacturing process of the organic layer OL.

The number of the trench patterns TRP is not particularly limited, and the trench patterns TRP may include first to n-th trench patterns (where n is a natural number of 2 or greater) located to be gradually further distant from the display region DA. According to some embodiments, first to third trench patterns TRP1, TRP2, and TRP3 are shown as an example. Hereinafter, the third trench pattern TRP3 indicates the n-th trench pattern, and the description of the third trench pattern TRP3 replaces the description of the n-th trench pattern.

The first to third trench patterns TRP1, TRP2, and TRP3 may have a closed line shape when viewed on a plane. The first to third trench patterns TRP1, TRP2, and TRP3 may have the same structure or different structures, and are not particularly limited. According to some embodiments, the first to third trench patterns TRP1, TRP2, and TRP3 have the same depth, have the same width, and are spaced apart from each other at the same distance.

An edge of the organic layer OL is located inside the n-th trench pattern, that is, the third trench pattern TRP3. The edge of the organic layer OL may be located inside the first trench pattern TRP1 or the second trench pattern TRP2. However, without being limited thereto, the edge of the organic layer OL may be located inside the third trench pattern TRP3, and the edge of the organic layer OL may be located in a region between the first trench pattern TRP1 and the second trench pattern TRP2, or in a region between the second trench pattern TRP2 and the third trench pattern TRP3.

The first inorganic layer IOL1 and the second inorganic layer IOL2 overlap a plurality of trench patterns TRP and seal the plurality of trench patterns TRP and the organic layer OL. The first inorganic layer IOL1 and the second inorganic layer IOL2 formed through deposition are entirely formed on the lower surface BS2-LS of the second base layer BS2, and extend outside the third trench pattern TRP3 among the plurality of trench patterns TRP.

The sealing member SLM is located outside the third trench pattern TRP3, and the sealing member SLM overlaps the first inorganic layer IOL1 and the second inorganic layer IOL2. The organic layer OL is not located between the sealing member SLM and the second base layer BS2.

FIGS. 6B and 6C show some processes for manufacturing the second display substrate 200. The second base layer BS2 on which the first to third trench patterns TRP1, TRP2, and TRP3 are formed is provided. The first to third trench patterns TRP1, TRP2, and TRP3 may be formed through a photo process and an etching process, or may be formed through laser irradiation. A manufacturing process after formation of the trench pattern TRP may be substantially the same as the one described with reference to FIGS. 4B and 4C.

Referring to FIG. 6B, first to third color filters CF-R, CF-G, and CF-B may be formed on one surface BS-LS of the second base layer BS2. Thereafter, the organic layer OL is formed on one surface BS-LS of the second base layer BS2.

In FIG. 6B, a liquid organic material LOL provided from an inkjet head IKL is shown in dotted line. The liquid organic material LOL flows towards the non-display region NDA. The liquid organic material LOL reaches the first trench pattern TRP1, and the first trench pattern TRP1 reduces flow velocity of the liquid organic material LOL.

Unlike the dam patterns DMP of FIGS. 4A to 4E, the first to third trench patterns TRP1, TRP2, and TRP3 do not protrude the organic layer OL upward. Accordingly, defects in which source light or converted light reflected from a portion of the protruding organic layer is concentrated on a specific region may be caused.

At least, the third trench pattern TRP3 may have a closed line shape (or a continuous-line shape). As a trench pattern having a closed line shape increases among the first to third trench patterns TRP1, TRP2, and TRP3, an area in which a liquid organic material spreads in the non-display region NDA, which will be described later, decreases. However, some of the first to third trench patterns TRP1, TRP2, and TRP3 may have an intermittent-line shape.

As shown in FIG. 6C, after the organic layer OL is formed through an inkjet process, the first inorganic layer IOL1 may be formed on an entire surface of the second base layer BS2 using a deposition process. Thereafter, the division pattern BW and the first, second, and third light control patterns CCF-R, CCF-G, and C-B are sequentially formed. In addition, the second inorganic layer IOL2 may be formed on the entire surface of the second base layer BS2 using a deposition process.

FIG. 6D shows first to third trench patterns TRP10, TRP20, and TRP30 according to some embodiments of the inventive concept, FIG. 6E shows first to third trench patterns TRP11, TRP21, and TRP31 according to some embodiments of the inventive concept, and FIG. 6F shows first to third trench patterns TRP12, TRP22, and TRP32 according to some embodiments of the inventive concept. According to FIGS. 6D to 6F, the depth, width, and spacing of the trench patterns may be variously modified. Hereinafter, detailed descriptions of the same configuration as the configuration described with reference to FIGS. 6A to 6C will be omitted.

Referring to FIG. 6D, the first to third trench patterns TRP10, TRP20, and TRP30 have the same widths W1, W2, and W3. Distances S1 and S2 between two adjacent trench patterns among the first to third trench patterns TRP10, TRP20, and TRP30 may be equal to each other. Depths E1, E2, and E3 of the first to third trench patterns TRP10, TRP20, and TRP30 may be different from each other. The depths E1, E2, and E3 of the first to third trench patterns TRP10, TRP20, and TRP30 may decrease when being farther from the display region DA.

Referring to FIG. 6E, widths W1, W2, and W3 of the first to third trench patterns TRP11, TRP21, and TRP31 may be different from each other. The widths W1, W2, and W3 of the first to third trench patterns TRP11, TRP21, and TRP31 may increase when being farther from the display region DA. Distances S1 and S2 between two adjacent trench patterns among the first to third trench patterns TRP11, TRP21, and TRP31 may be equal to each other. Depths E1, E2, and E3 of the first to third trench patterns TRP11, TRP21, and TRP31 may be equal to each other.

Referring to FIG. 6F, the first to third trench patterns TRP12, TRP22, and TRP32 may have the same widths W1, W2, and W3. Distances S1 and S2 between two adjacent trench patterns among the first to third trench patterns TRP12, TRP22, and TRP32 may be different from each other. The distances S1 and S2 may increase when being farther from the display region DA. Depths E1, E2, and E3 of the first to third trench patterns TRP12, TRP22, and TRP32 may be equal to each other.

Figure 7A:
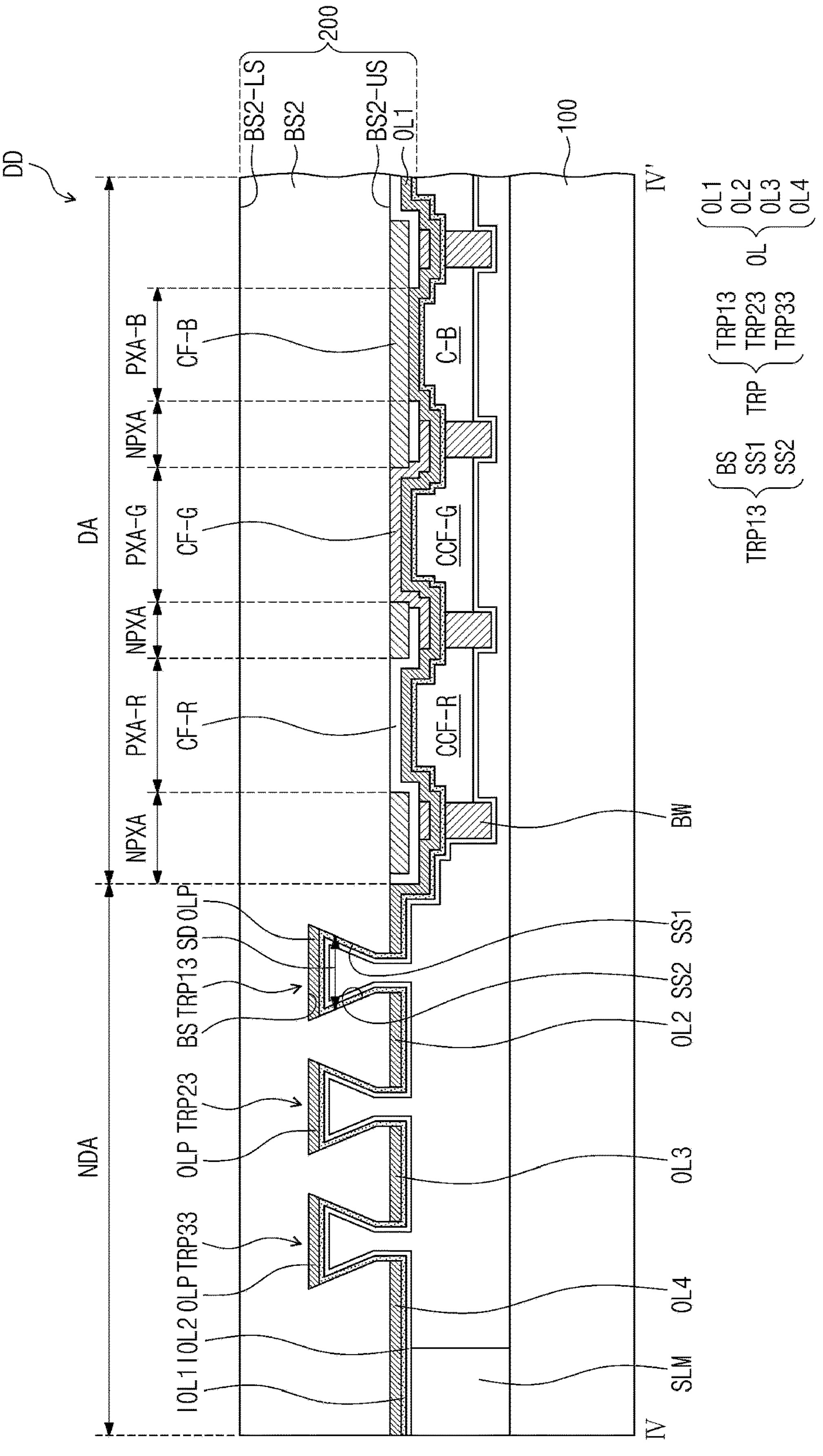
FIG. 7A is a cross-sectional view of a display device according to some embodiments of the inventive concept.
Figure 7B:
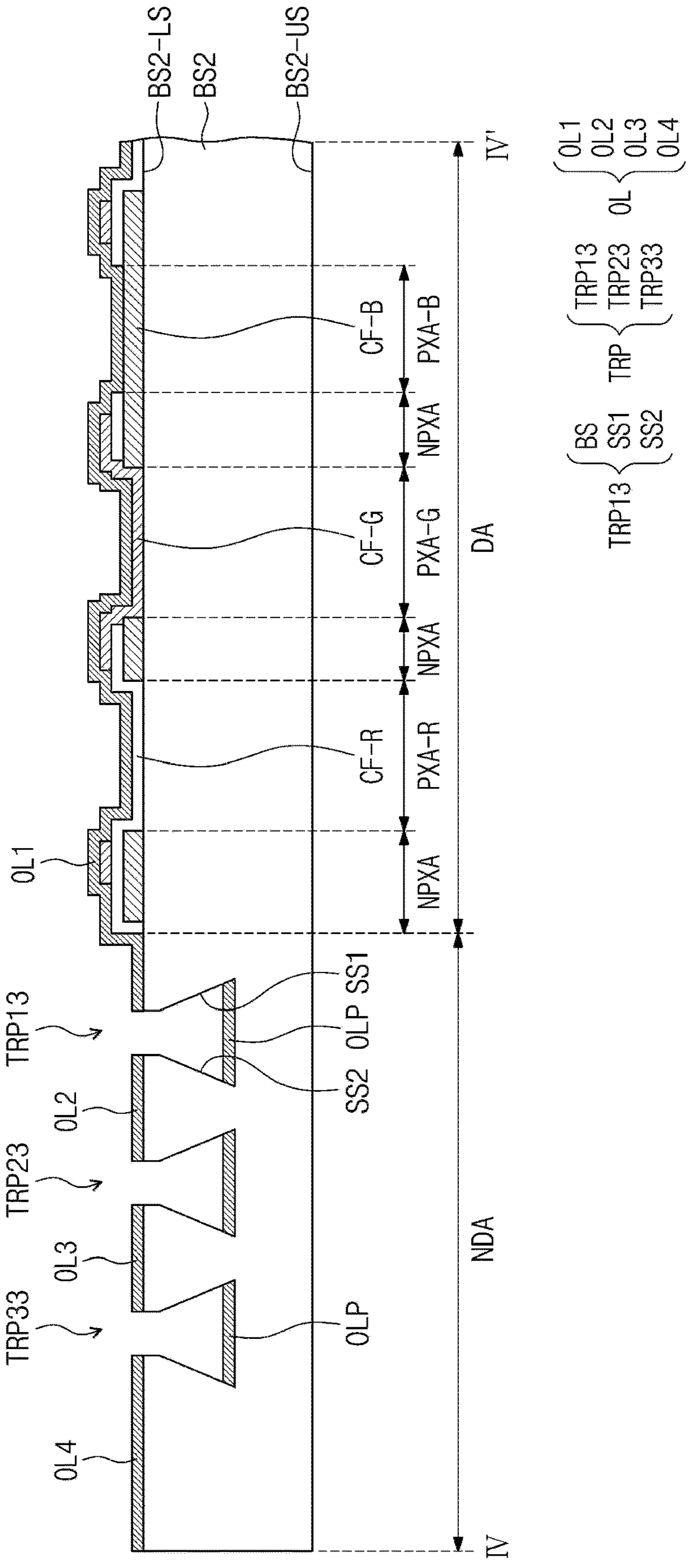
FIGS. 7B and 7C are cross-sectional views showing a method for manufacturing a second display substrate according to some embodiments of the inventive concept.
Figure 7C:
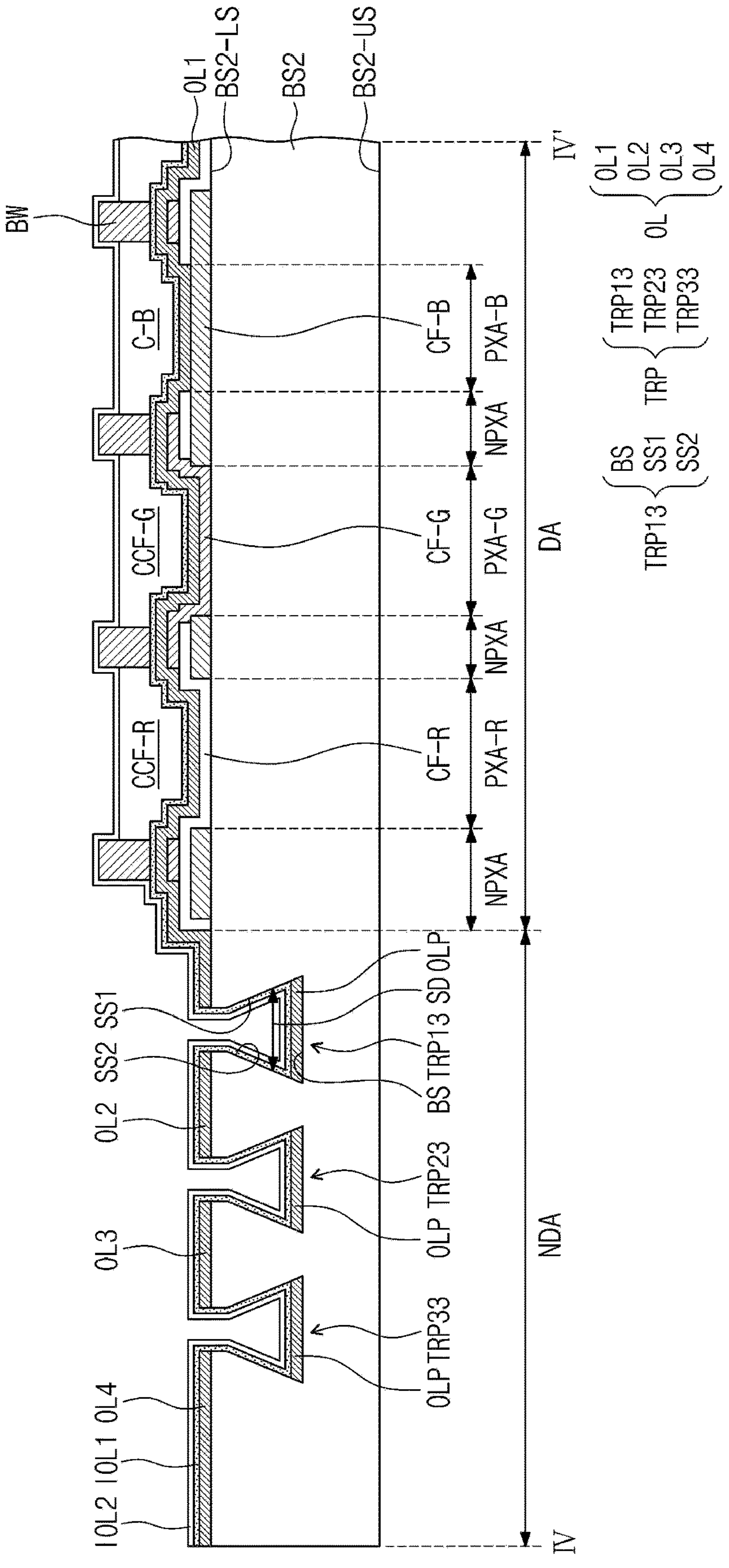

FIG. 7A is a cross-sectional view of a display device DD according to some embodiments of the inventive concept. FIGS. 7B and 7C are cross-sectional views showing a method for manufacturing a second display substrate 200 according to some embodiments of the inventive concept. Hereinafter, detailed descriptions overlapping the configuration in FIGS. 6A to 6C will be omitted.

The first, second, and third trench patterns TRP13, TRP23, and TRP33 shown in FIG. 7A have different shapes from the trench pattern TRP described with reference to FIGS. 6A to 6E. Each of the first, second, and third trench patterns TRP13, TRP23, and TRP33 includes a bottom surface BS, and a first side surface SS1 (or a first sidewall) and a second side surface SS2 connecting the bottom surface BS and the lower surface BS2-LS of the second base layer BS2, respectively. Each of the first side surface SS1 and the second side surface SS2 defines an acute angle (or an acute internal angle) with respect to the bottom surface BS. The distance SD between the first side surface SS1 and the second side surface SS2 increases from the lower surface BS2-LS of the second base layer BS2 towards the bottom surface BS.

Referring to the trench pattern TRP described with reference to FIGS. 6A to 6E, each of the first side surface and the second side surface defines a substantially right angle with respect to the bottom surface. Meanwhile, referring to the trench pattern TRP described with reference to FIGS. 6A to 6E, each of the first side surface and the second side surface may define an obtuse angle with respect to a bottom surface.

Referring to FIG. 7A, the organic layer OL is entirely located on the lower surface BS2-LS of the second base layer BS2. The organic layer OL includes a first portion OL1 located inside the first trench pattern TRP13 and overlapping the display region DA, a second portion OL2 located between the first trench pattern TRP13 and the second trench pattern TRP23, a third portion OL3 located between the second trench pattern TRP23 and the third trench pattern TRP33, and a fourth portion OL4 located outside the third trench pattern TRP33. The fourth portion OL4 is located between the sealing member SLM and the lower surface BS2-LS of the second base layer BS2. The number of portions constituting the organic layer OL may be determined according to the number of trench patterns.

An organic pattern OLP is located on the bottom surface BS of each of the first, second, and third trench patterns TRP13, TRP23, and TRP33. The organic pattern OLP and the second to fourth portions OL2, OL3, and OL4 may have a closed line shape when viewed on a plane.

The first to fourth portions OL1, OL2, OL3, and OL4 are separated by first, second, and third trench patterns TRP13, TRP23, and TRP33. Even when the organic layer OL is entirely located on the lower surface BS2-LS of the second base layer BS2, and the fourth portion OL4 is located between the sealing member SLM and the lower surface BS2-LS of the second base layer BS2, a path into which moisture is introduced may be blocked by the first, second, and third trench patterns TRP13, TRP23, and TRP33.

Even when moisture is introduced from the outside of the display device DD into an interface between the organic layer OL and the second base layer BS2 or an interface between the organic layer OL and the first inorganic layer IOL1, moisture may be prevented from moving by the first, second, and third trench patterns TRP13, TRP23, and TRP33. The first inorganic layer IOL1 and the second inorganic layer IOL2 are closely bonded to the first side surface SS1 of each of the first, second, and third trench patterns TRP13, TRP23, TRP33, and the first inorganic layer IOL1 and the second inorganic layer IOL2 are closely bonded to the second side surface SS2 to block the moisture moving path.

Referring to FIGS. 7B, the second base layer BS2 on which the first to third trench patterns TRP13, TRP23, and TRP33 are formed is provided. For example, the first to third trench patterns TRP13, TRP23, and TRP33 may be formed by obliquely (in an inclined manner) irradiating one surface BS-LS of the second base layer BS2 with a laser.

Thereafter, first to third color filters CF-R, CF-G, and CF-B may be formed on one surface BS-LS of the second base layer BS2. Thereafter, the organic layer OL is formed on one surface BS-LS of the second base layer BS2. When a liquid organic material goes through coating through a slit coating process and then curing, the organic layer OL is formed except for the first side surface SS1 and the second side surface SS2 of each of the first, second, and third trench patterns TRP13, TRP23, and TRP33.

As shown in FIG. 7C, thereafter, the first inorganic layer IOL1 may be formed on an entire surface of the second base layer BS2 using a deposition process. The first inorganic layer IOL1 may also be formed on the first side surface SS1 and the second side surface SS2 because an inorganic material is formed through a deposition process such as a CVD process. Thereafter, the division pattern BW and the first, second, and third light control patterns CCF-R, CCF-G, and C-B are sequentially formed. In addition, the second inorganic layer IOL2 may be formed on the entire surface of the second base layer BS2 using a deposition process.

According to some embodiments, the display device DD shown in FIGS. 6A to 6E may be formed using the first, second, and third trench patterns TRP13, TRP23, and TRP33 shown in FIG. 7A. The liquid organic material LOL (see FIG. 6B) may spread to the non-display region NDA and flow to the first, second, and third trench patterns TRP13, TRP23, and TRP33. The first, second, and third trench patterns TRP13, TRP23, and TRP33 may prevent the liquid organic material LOL (see FIG. 6B) from flowing to the outside of at least the third trench patterns TRP33. When the liquid organic material LOL goes through curing, an organic layer OL similar to the one shown in FIGS. 7A to 7C is formed. However, at least the fourth portion OL4 may be omitted.

Figure 8A:
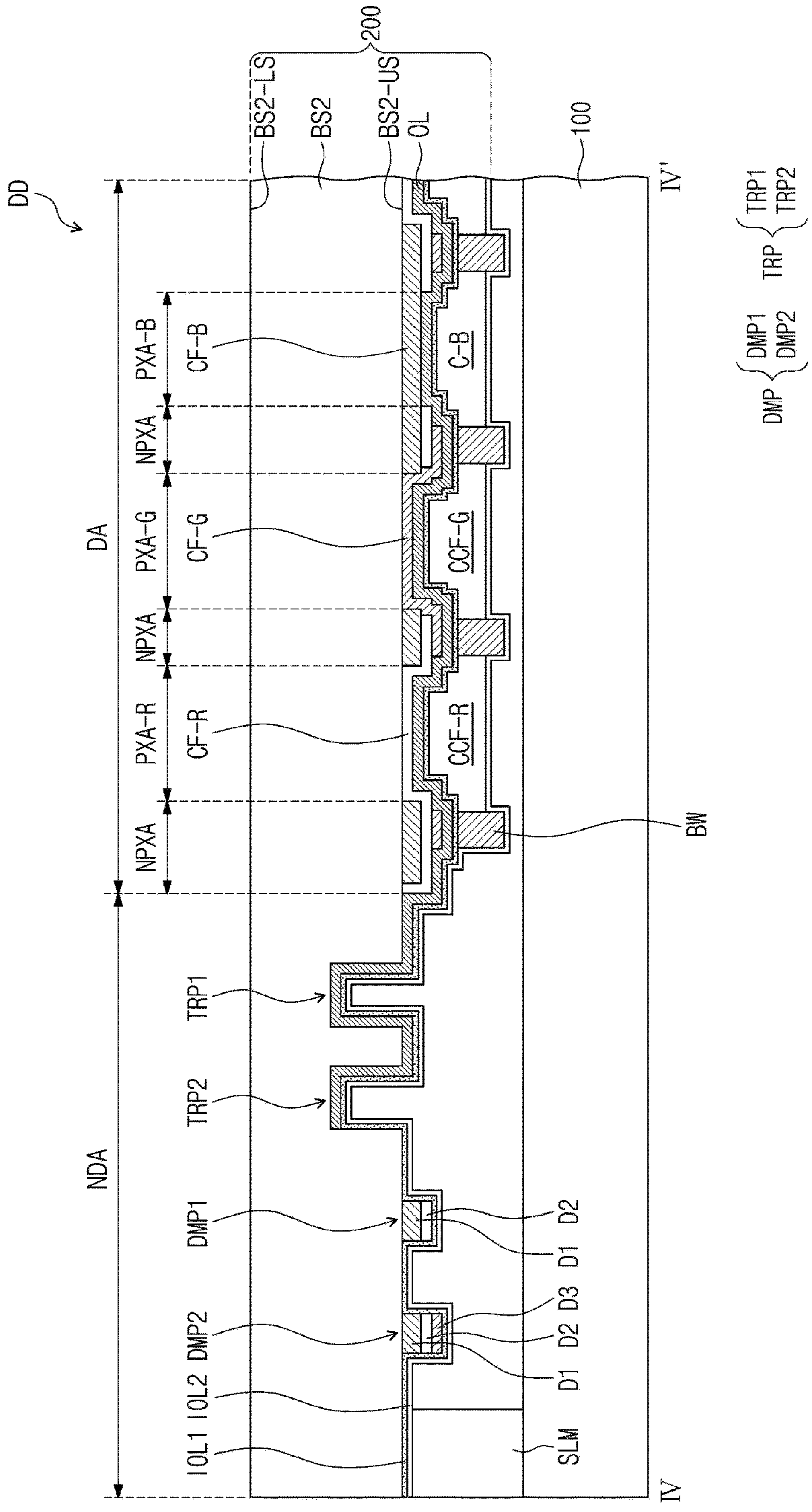
FIGS. 8A and 8B are cross-sectional views of a display device according to some embodiments of the inventive concept.
Figure 8B:
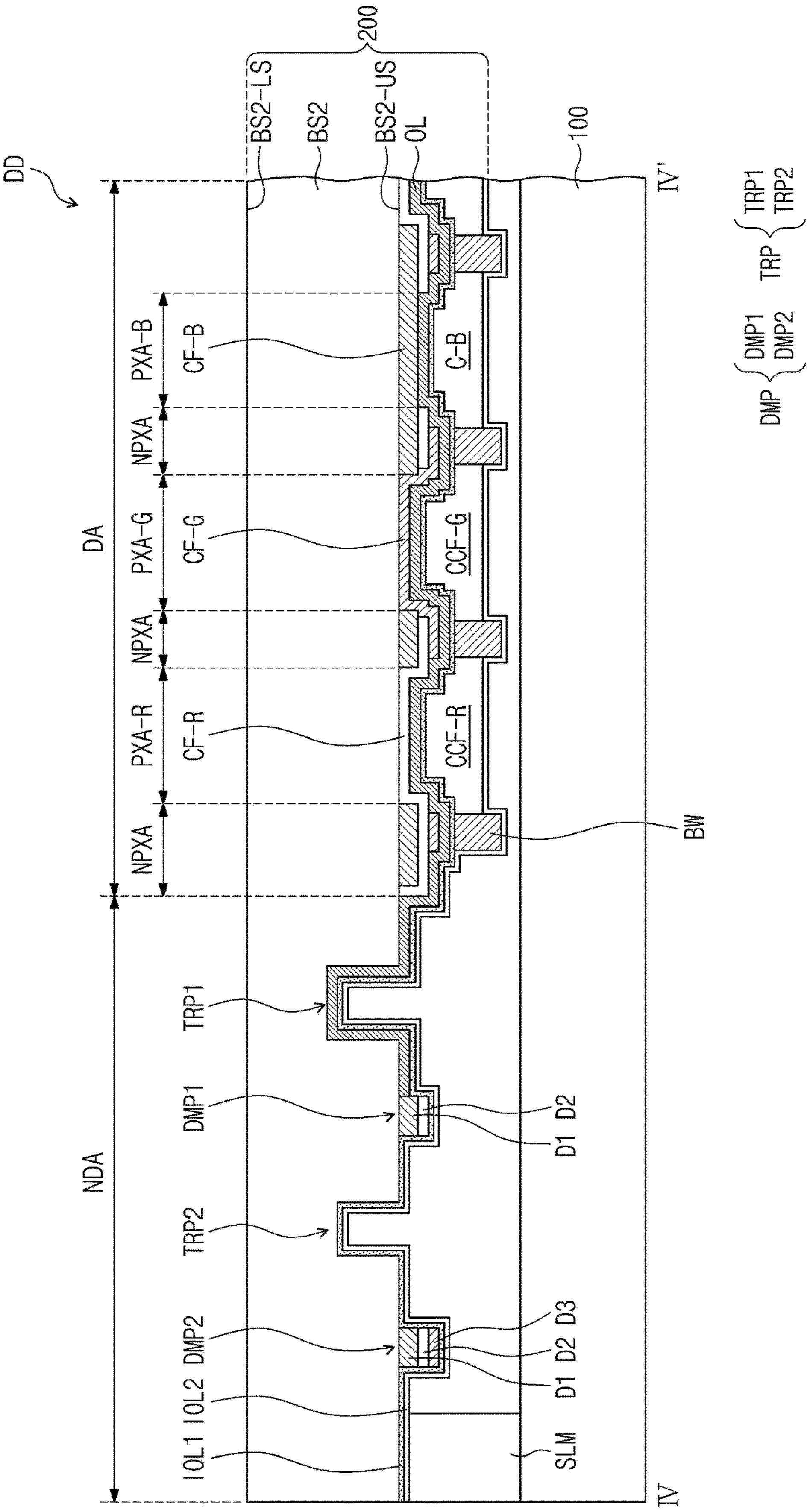

FIGS. 8A and 8B are cross-sectional views of a display device DD according to some embodiments of the inventive concept. Hereinafter, detailed descriptions overlapping the configuration in FIGS. 1A to 7C will be omitted.

Referring to FIGS. 8A and 8B, at least one dam pattern DMP overlapping the non-display region NDA may be located on the lower surface BS2-LS of the second base layer BS2. In addition, at least one trench pattern TRP may be defined on the lower surface BS2-LS of the second base layer BS2. The dam pattern DMP and the trench pattern TRP may control flow of a liquid organic material in the manufacturing process of the organic layer OL.

Although the first and second dam patterns DMP1 and DMP2 and the first and second trench patterns TRP1 and TRP2 are shown in FIGS. 8A and 8B as an example, the embodiment of the inventive concept is not limited thereto.

As shown in FIG. 8A, the first and second trench patterns TRP1 and TRP2 may be located closer to the display region DA than the first and second dam patterns DMP1 and DMP2. Because the first and second trench patterns TRP1 and TRP2 are intaglio dam patterns, a structure in which the organic layer OL protrudes towards the first display substrate 100 at a border between the display region DA and the non-display region NDA may be prevented.

Referring to FIG. 8A, an edge of the organic layer OL is shown to be located in the second trench pattern TRP2, but when a liquid organic material overflows the second trench pattern TRP2, the edge of the organic layer OL may contact the first dam pattern DMP1 or the second dam pattern DMP2.

However, the embodiment of the inventive concept is not limited thereto, and the first and second dam patterns DMP1 and DMP2 may be located closer to the display region DA than the first and second trench patterns TRP1 and TRP2. In this case, the first dam pattern DMP1 may have a lower height than the second dam pattern DMP2.

As shown in FIG. 8B, the first and second trench patterns TRP1 and TRP2 and the first and second dam patterns DMP1 and DMP2 may be alternately arranged. However, the first trench pattern TRP1 may be located closer to the display region DA than the first dam pattern DMP1. Referring to FIG. 8B, the edge of the organic layer OL is shown to be in contact with the first dam pattern DMP1, but is not limited thereto.

Figure 9A:
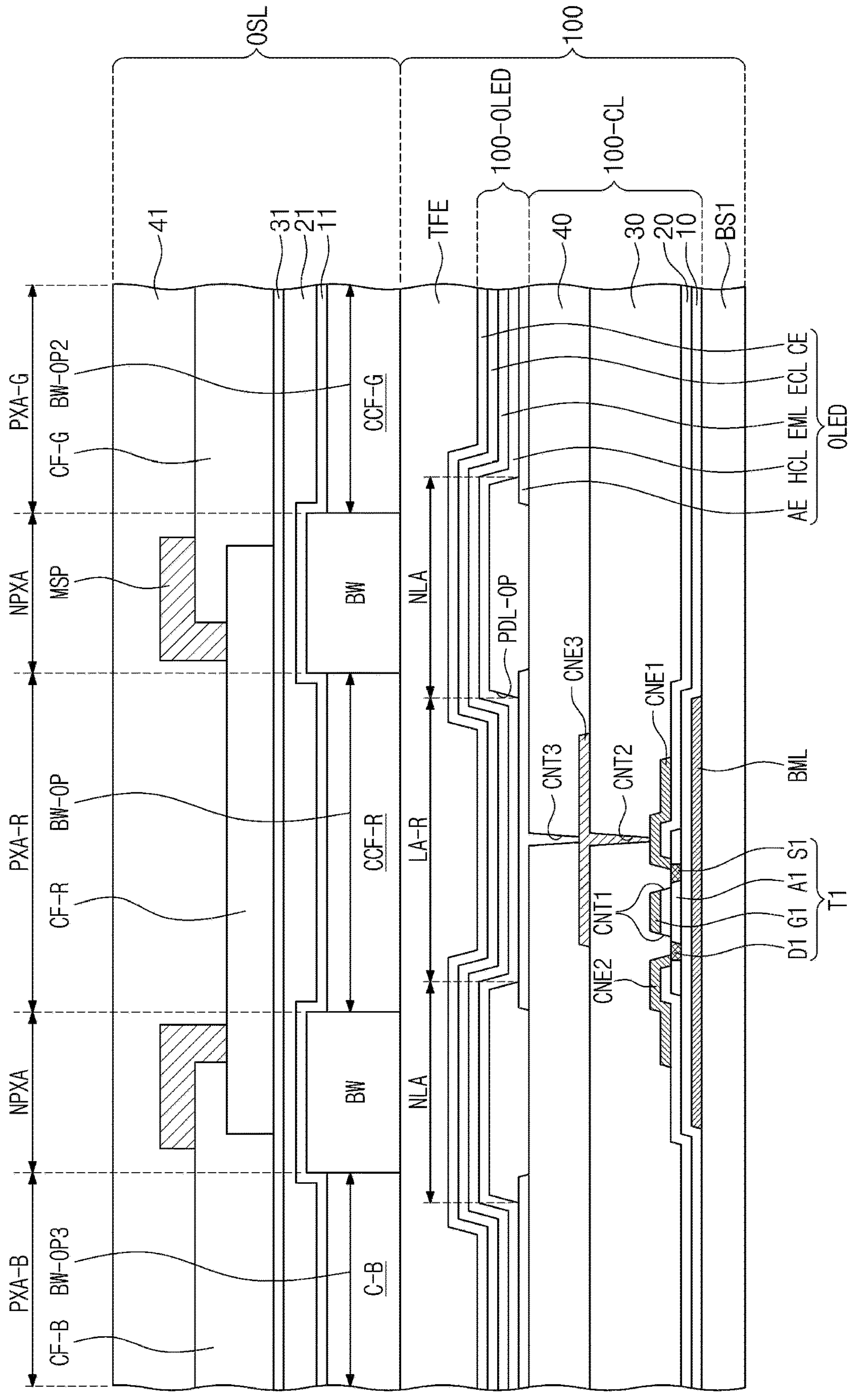
FIGS. 9A and 9B are cross-sectional views of a display device according to some embodiments of the inventive concept.
Figure 9B:
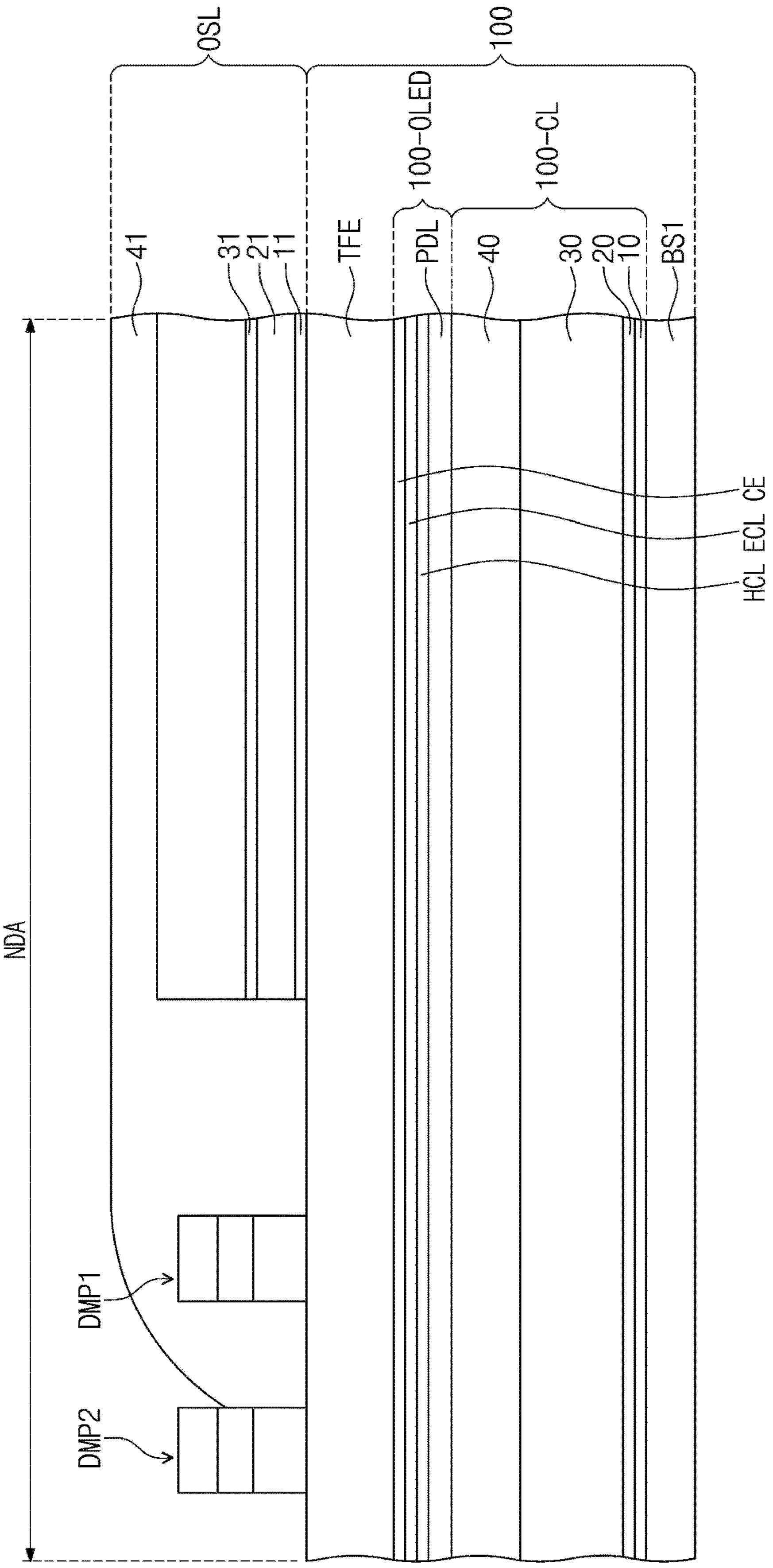

FIGS. 9A and 9B are cross-sectional views of a display device DD according to some embodiments of the inventive concept. According to some embodiments, unlike the display device DD described with reference to FIGS. 1A to 5C, a single display substrate is included. In more detail, structures of the second display substrate 200 are continuously formed on the first display substrate 100. Hereinafter, detailed descriptions of the same configuration as the configuration described with reference to FIGS. 1A to 5C will refer to FIGS. 1A to 5C, and overlapping descriptions will be omitted.

FIG. 9A is a cross-sectional view corresponding to FIG. 3B and additionally showing the second pixel region PXA-G and the third pixel region PXA-B adjacent thereto around the first pixel region PXA-R. A light control layer OSL is located on the thin film encapsulation layer TFE. The light control layer OSL may include a division pattern BW, first, second, and third light control patterns CCF-R, CCF-G, C-B, at least one insulating layer 11, 21, 31, and 41, and color filters CF-R, CF-G, and CF-B.

The division pattern BW is located on the thin film encapsulation layer TFE. The first light control pattern CCF-R is located in a first opening BW-OP1. The second and third light control patterns CCF-G, and C-B are respectively located in second and third openings BW-OP2 and BW-OP3. The first, second, and third pixel regions PXA-R, PXA-G, and PXA-B may be defined to correspond to the first, second, and third openings BW-OP1, BW-OP2, and BW-OP3.

A first insulating layer 11 is located on the thin film encapsulation layer TFE to cover the division pattern BW and the first, second, and third light control patterns CCF-R, CCF-G, and C-B. The first insulating layer 11 may be an inorganic layer that seals the division pattern BW and the first, second, and third light control patterns CCF-R, CCF-G, and C-B. According to some embodiments of the inventive concept, the first insulating layer 11 may be omitted.

A second insulating layer 21 is located on the first insulating layer 11. The second insulating layer 21 may have a lower refractive index than the first insulating layer 11. The second insulating layer 21 may have a refractive index of about 1.1 to about 1.5. The refractive index of the second insulating layer 21 may be controlled through the proportion of hollow inorganic particles and/or voids included in the second insulating layer 21. The second insulating layer 21 may provide source light and changed light more vertically. A third insulating layer 31 of the light control layer OSL is located on the second insulating layer 21. The third insulating layer 31 may be an inorganic layer that seals lower structures. The third insulating layer 31 may be omitted.

On the third insulating layer 31, the first color filter CF-R corresponding to the first pixel region PXA-R is located, the second color filter CF-G corresponding to the second pixel region PXA-G is located, and the third color filter CF-B corresponding to the third pixel region PXA-B is located. An adjacent color filter among the first color filter CF-R, the second color filter CF-G, and the third color filter CF-B may overlap within the peripheral region NPXA. An organic material pattern MSP serving a function of a black matrix may be located in the peripheral region NPXA. The stack order of the first color filter CF-R, the second color filter CF-G, the third color filter CF-B, and the organic pattern MSP is not particularly limited.

A fourth insulating layer 41 is located on the first color filter CF-R, the second color filter CF-G, the third color filter CF-B, and the organic pattern MSP. The fourth insulating layer 41 may include an organic layer and provide a flat surface.

FIG. 9B is a cross-sectional view corresponding to the non-display region NDA of FIG. 4A. The light emitting element OLED and a pixel driving circuit are not located in the non-display region NDA. In addition, the division pattern BW and the first, second, and third light control patterns CCF-R, CCF-G, and C-B are not located in the non-display region NDA. The division pattern BW in which the openings BW-OP1, BW-OP2, and BW-OP3 are not formed may be located in the non-display region NDA. As shown in FIG. 9B, the first insulating layer 11, the second insulating layer 21, and the third insulating layer 31 may extend up to the non-display region NDA. The first insulating layer 11, the second insulating layer 21, and the third insulating layer 31 may be located only on a portion of the non-display region NDA and expose a portion of the thin film encapsulation layer TFE. At least one dam pattern DMP1 and DMP2 may be located outside edges of the first insulating layer 11, the second insulating layer 21, and the third insulating layer 31. The first dam pattern DMP1 and the second pattern DMP2 are shown as an example. The functions and stack structures of the dam patterns DMP1 and DMP2 are described with reference to FIGS. 1A to 5C.

As described with reference to FIG. 4B, the fourth insulating layer 41 may be formed by printing a liquid organic material with the inkjet head IKL. The liquid organic material provided in the display region DA flows towards the non-display region NDA. The liquid organic material may reach the first dam pattern DMP1, and the flow of the liquid organic material may stop through the second pattern DMP2. The fourth insulating layer 41 formed through a curing process is shown in FIG. 9B.

As described above, an organic layer having a relatively low refractive index generates a photo-recycling effect. Non-converted source light may be provided back to a quantum dot pattern and converted into light of a different color from the source light in the quantum dot pattern. Accordingly, the quantum dot pattern may have relatively increased photo-conversion efficiency.

The organic layer non-overlaps a region in which a sealing member is located, and is located inside the sealing member when viewed on a plane. A path into which moisture is introduced from an edge of a display device to the organic layer may be blocked.

A dam pattern or a trench pattern may control flow of a liquid organic material in processes of forming the organic layer. For example, an occupied region of the liquid organic material may be limited to the inside of the dam pattern or the trench pattern. Accordingly, the organic layer may be formed according to a desired design.

Although the present disclosure has been described with reference to some example embodiments of the inventive concept, it will be understood that the inventive concept should not be limited to these example embodiments but various changes and modifications can be made by those skilled in the art without departing from the spirit and scope of the present disclosure.

Hence, the technical scope of the present disclosure is not limited to the detailed descriptions in the specification but should be determined only with reference to the claims, and their equivalents.

What is claimed is:

1. A display device comprising:

a first display substrate including first, second, and third light emitting elements;

a second display substrate including a non-display region and a display region including first, second, and third pixel regions respectively corresponding to the first, second, and third light emitting elements; and a sealing member overlapping the non-display region in a plan view and between the first display substrate and the second display substrate, wherein the second display substrate includes:

a base layer;

first, second, and third color filters on a surface of the base layer and respectively overlapping the first, second, and third pixel regions;

at least one dam pattern on the surface of the base layer, spaced apart from the sealing member in the plan view, and overlapping the non-display region in the plan view;

an organic layer below the first, second, and third color filters, a first inorganic layer below the organic layer and overlapping the non-display region and the display region;

a division pattern below the first inorganic layer and having first, second, and third openings respectively corresponding to the first, second, and third pixel regions;

first, second, and third light control patterns inside the first, second, and third openings, respectively; and a second inorganic layer below the division pattern and the first, second, and third light control patterns and overlapping the non-display region and the display region, and the sealing member overlaps the first inorganic layer and the second inorganic layer in the non-display region and non-overlaps the organic layer, and is farther from the display region than the at least one dam pattern in the plan view.

2. The display device of claim 1, wherein the at least one dam pattern comprises first to n-th dam patterns (where n is a natural number of 2 or greater) arranged to have gradually larger spaces between adjacent dam patterns as a distance from the display region increases, and at least one of the first to n-th dam patterns has a closed line shape.

3. The display device of claim 1, wherein the at least one dam pattern comprises first to n-th dam patterns (where n is a natural number of 2 or greater) arranged to have gradually larger spaces between adjacent dam patterns as a distance from the display region increases, and the first dam pattern has a lower height than the n-th dam pattern.

4. The display device of claim 1, wherein the at least one dam pattern comprises first to n-th dam patterns (where n is a natural number of 2 or greater) arranged to have gradually larger spaces between adjacent dam patterns as a distance from the display region increases, and any one of the first to n-th dam patterns comprises a first layer, a second layer below the first layer, and a third layer below the second layer, and the first layer comprises the same material as any one of the first, second, and third color filters, the second layer comprises the same material as another one of the first, second, and third color filters, and the third layer comprises the same material as the other one of the first, second, and third color filters.

5. The display device of claim 4, wherein the second layer surrounds a side surface of the first layer, and the third layer surrounds a side surface of the second layer.

6. The display device of claim 4, wherein the first layer has a width greater than or equal to a width of the second layer, and the third layer has a width less than or equal to the width of the second layer.

7. The display device of claim 1, wherein the at least one dam pattern comprises first to n-th dam patterns (where n is a natural number of 2 or greater) arranged to have gradually larger spaces between adjacent dam patterns as a distance from the display region increases, and the organic layer overlaps the first dam pattern, and an edge of the organic layer is positioned between adjacent dam patterns among the second to n-th dam patterns.

8. The display device of claim 1, wherein the display region further comprises a peripheral region between the first, second, and third pixel regions, and at least two or more color filters among the first, second, and third color filters overlap in the peripheral region.

9. The display device of claim 1, wherein each of the first, second, and third light emitting elements is configured to generate blue source light, first and second filter openings respectively corresponding to the first and second pixel regions are defined in the third color filter, and the third color filter overlaps the third pixel region, and the third color filter is a blue color filter.

10. The display device of claim 9, wherein the first and second light control patterns comprise a base resin and quantum dots mixed with the base resin, and the third light control pattern comprises a base resin without quantum dots.

11. The display device of claim 9, wherein each of the first, second, and third light emitting elements comprises a first electrode, a second electrode on the first electrode, and an emission layer between the first electrode and the second electrode, and the emission layer of the first light emitting element, the emission layer of the second light emitting element, and the emission layer of the third light emitting element have a single-body shape.

12. The display device of claim 1, wherein the organic layer has a lower refractive index than the first inorganic layer.

13. The display device of claim 1, wherein the organic layer comprises a synthetic resin and porogen or hollow silica, which is mixed with the synthetic resin.

14. The display device of claim 1, further comprising a filling material filling a gap between the first display substrate and the second display substrate.

15. The display device of claim 1, wherein at least one trench pattern is defined on the surface of the base layer, the at least one trench pattern overlaps the non-display region in the plan view, and the organic layer is inside the at least one trench pattern.

16. A display device comprising:

a first display substrate including a plurality of light emitting elements;

a second display substrate including a non-display region and a display region including a plurality of pixel regions respectively corresponding to the plurality of light emitting elements; and a sealing member overlapping the non-display region in a plan view and between the first display substrate and the second display substrate so as to maintain a gap between the first display substrate and the second display substrate, wherein the second display substrate includes:

a base layer;

a plurality of color filters on a surface of the base layer and overlapping each of the plurality of pixel regions;

a plurality of organic patterns each overlapping the plurality of color filters in a plan view, and spaced apart from each other;

an inorganic layer below the plurality of organic patterns and overlapping the non-display region and the display region;

a division pattern below the inorganic layer and having a plurality of openings respectively corresponding to the plurality of pixel regions; and a quantum dot pattern in a corresponding one of the plurality of openings, the sealing member overlaps the inorganic layer in the non-display region and non-overlaps the plurality of organic patterns, and each of the organic patterns has a lower refractive index than the inorganic layer.

17. A display device comprising:

a first display substrate including first, second, and third light emitting elements;

a second display substrate including a non-display region and a display region including first, second, and third pixel regions respectively corresponding to the first, second, and third light emitting elements; and a sealing member overlapping the non-display region in a plan view and between the first display substrate and the second display substrate, wherein the second display substrate includes:

a base layer overlapping the non-display region in the plan view and having first to n-th trench patterns (where n is a natural number of 2 or greater) recessed from the base layer on a lower surface thereof so as to have gradually larger spaces between adjacent trench patterns as a distance from the display region increases;

first, second, and third color filters on the lower surface of the base layer and respectively overlapping the first, second, and third pixel regions;

an organic layer below the first, second, and third color filters, a first inorganic layer below the organic layer and overlapping the non-display region and the display region;

a division pattern below the first inorganic layer and having first, second, and third openings respectively corresponding to the first, second, and third pixel regions;

first, second, and third light control patterns inside the first, second, and third openings, respectively; and a second inorganic layer below the division pattern and the first, second, and third light control patterns and overlapping the non-display region and the display region, and the sealing member overlaps the first inorganic layer and the second inorganic layer in the non-display region and non-overlaps the organic layer, and is farther from the display region than the n-th trench pattern in the plan view.

18. The display device of claim 17, wherein at least one of the first to n-th trench patterns has a closed line shape.

19. The display device of claim 17, wherein the organic layer overlaps the first trench pattern, and an edge of the organic layer is positioned within the second to n-th trench patterns.

20. The display device of claim 17, wherein each of the first to n-th trench patterns comprises a bottom surface, and a first side surface and a second side surface that connect the bottom surface and the lower surface of the base layer, respectively, and a distance between the first side surface and the second side surface increases from the lower surface of the base layer towards the bottom surface.

21. A display device comprising:

a base layer including a non-display region and a display region;

first, second, and third light emitting elements on the base layer and overlapping the display region;

a thin film encapsulation layer sealing the first, second, and third light emitting elements;

a division pattern on the thin film encapsulation layer, first, second, and third openings respectively corresponding to the first, second, and third light emitting elements being defined in the division pattern;

first, second, and third light control patterns respectively inside the first, second, and third openings;

at least one insulating layer on the division pattern and the first, second, and third light control patterns;

first, second, and third color filters on the at least one insulating layer and respectively overlapping the first, second, and third light control patterns;

at least one dam pattern directly on the thin film encapsulation layer and overlapping the non-display region; and an organic layer covering the first, second, and third color filters and overlapping the non-display region and the display region, wherein an edge of the organic layer is inside the at least one dam pattern, and the at least one dam pattern includes the same material as at least one of the first, second, or third color filters, wherein the at least one dam pattern is exposed by the at least one insulating layer.

22. The display device of claim 21, wherein the at least one insulating layer comprises a layer having a refractive index of 1.1 to 1.5.

23. The display device of claim 22, wherein the at least one insulating layer further comprises inorganic layers each below and above the layer having a refractive index of 1.1 to 1.5.

24. The display device of claim 21, wherein the at least one dam pattern comprises first to n-th dam patterns (where n is a natural number of 2 or greater) arranged to have gradually larger spaces between adjacent dam patterns as a distance from the display region increases, and at least one of the first to n-th dam patterns a closed line shape.

25. The display device of claim 21, wherein the at least one dam pattern comprises first to n-th dam patterns (where n is a natural number of 2 or greater) arranged to have gradually larger spaces between adjacent dam patterns as a distance from the display region increases, any one of the first to n-th dam patterns comprises a first layer, a second layer below the first layer, and a third layer below the second layer, and the first layer comprises the same material as any one of the first, second, and third color filters, the second layer comprises the same material as another one of the first, second, and third color filters, and the third layer comprises the same material as the other one of the first, second, and third color filters.

26. The display device of claim 21, wherein the first and second light control patterns comprise a base resin and quantum dots, and the third light control pattern comprises a base resin.

* * * * *